US006939143B2

(12) United States Patent
Rathburn

(10) Patent No.: US 6,939,143 B2
(45) Date of Patent: Sep. 6, 2005

(54) FLEXIBLE COMPLIANT INTERCONNECT ASSEMBLY

(75) Inventor: James J. Rathburn, Greenfield, MN (US)

(73) Assignee: Gryphics, Inc., Plymouth, MN (US)

( * ) Notice: Subject to any disclaimer, the term of this patent is extended or adjusted under 35 U.S.C. 154(b) by 258 days.

(21) Appl. No.: 10/169,431

(22) PCT Filed: Jan. 11, 2001

(86) PCT No.: PCT/US01/00872

§ 371 (c)(1), (2), (4) Date: Jun. 26, 2002

(87) PCT Pub. No.: WO01/54232

PCT Pub. Date: Jul. 26, 2001

(65) Prior Publication Data

US 2003/0003779 A1 Jan. 2, 2003

Related U.S. Application Data

(60) Provisional application No. 60/177,112, filed on Jan. 20, 2000.

(51) Int. Cl.[7] ................................................ H01R 12/00

(52) U.S. Cl. ............................. 439/66; 439/91; 439/85; 439/260; 439/329; 439/492; 439/591

(58) Field of Search ............................... 439/66–69, 85, 439/91, 329, 429–494, 591–592

(56) References Cited

U.S. PATENT DOCUMENTS 2,958,064 A 10/1960 Swengel
3,880,486 A 4/1975 Avakian (Continued)

FOREIGN PATENT DOCUMENTS

EP 0 351 851 A2 1/1990
EP 0 351 851 A3 1/1990

(Continued)

OTHER PUBLICATIONS

"Silicon Contact Technology for Test and Burn–In of FBGA Packages", Bear Technology, Inc. Rev, 9/97, pp. 1–12 (1997).

*Primary Examiner*—Truc T. T. Nguyen
(74) *Attorney, Agent, or Firm*—Faegre & Benson LLP

(57) ABSTRACT

A method and apparatus for achieving a fine pitch interconnect between a flexible circuit member and another circuit member with co-planar electrical contacts that have a large range of compliance. The interconnect assembly includes a substrate with one or more compliant raised portions. At least one flexible circuit member having a first surface with a plurality of contact pads and a second surface is provided. The substrate is located along the second surface of the flexible circuit member with the compliant raised portions aligned with the contact pads so that the compliant raised portions bias the contact pads with corresponding contact pads on the first circuit member when in a compressive relationship.

32 Claims, 17 Drawing Sheets

U.S. PATENT DOCUMENTS

| | | | |
|---|---|---|---|
| 3,904,934 A | | 9/1975 | Martin |
| 3,964,813 A | | 6/1976 | Pizzeck |
| 4,118,090 A | | 10/1978 | Del Mei |
| 4,161,346 A | | 7/1979 | Cherian et al. |
| 4,165,909 A | | 8/1979 | Yeager et al. |
| 4,189,200 A | | 2/1980 | Yeager et al. |
| 4,445,735 A | | 5/1984 | Bonnefoy |
| 4,468,074 A | | 8/1984 | Gordon |
| 4,498,722 A | | 2/1985 | Fedder et al. |
| 4,509,099 A | | 4/1985 | Takamatsu et al. |
| 4,528,500 A | | 7/1985 | Lightbody et al. |
| 4,548,451 A | | 10/1985 | Benarr et al. |
| 4,575,170 A | | 3/1986 | Gurley |
| 4,579,411 A | | 4/1986 | Cobaugh et al. |
| 4,593,961 A | | 6/1986 | Cosmo |
| 4,603,928 A | | 8/1986 | Evans |
| 4,610,495 A | | 9/1986 | Landi |
| 4,629,270 A | | 12/1986 | Andrews, Jr. et al. |
| 4,648,668 A | | 3/1987 | Sinisi |
| 4,655,524 A | | 4/1987 | Etzel |
| 4,691,972 A | | 9/1987 | Gordon |
| 4,700,132 A | | 10/1987 | Yarbrough et al. |
| 4,758,176 A | | 7/1988 | Abe et al. |
| 4,768,971 A | | 9/1988 | Simpson |
| 4,789,345 A | | 12/1988 | Carter |
| 4,793,814 A | | 12/1988 | Zifcak et al. |
| 4,872,853 A | | 10/1989 | Webster |
| 4,904,197 A | | 2/1990 | Cabourne |
| 4,913,656 A | | 4/1990 | Gordon et al. |
| 4,927,369 A | | 5/1990 | Grabbe et al. |
| 4,954,878 A | | 9/1990 | Fox et al. |
| 4,976,626 A | | 12/1990 | Dibble et al. |
| 5,007,842 A | | 4/1991 | Deak et al. |
| 5,049,084 A | | 9/1991 | Bakke |
| 5,061,192 A | | 10/1991 | Chapin et al. |
| 5,071,359 A | | 12/1991 | Arnio et al. |
| 5,096,426 A | | 3/1992 | Simpson et al. |
| 5,099,393 A | | 3/1992 | Bentlage et al. |
| 5,152,695 A | | 10/1992 | Grabbe et al. |
| 5,156,553 A | | 10/1992 | Katsumata et al. |
| 5,163,834 A | | 11/1992 | Chapin et al. |
| 5,167,512 A | | 12/1992 | Walkup |
| 5,173,055 A | | 12/1992 | Grabbe |
| 5,199,889 A | | 4/1993 | McDevitt, Jr. |
| 5,203,075 A | | 4/1993 | Angulas et al. |
| 5,207,585 A | | 5/1993 | Byrnes et al. |
| 5,227,959 A | | 7/1993 | Rubinstein et al. |
| 5,252,916 A | | 10/1993 | Swart |
| 5,299,090 A | | 3/1994 | Brady et al. |
| 5,321,884 A | | 6/1994 | Ameen et al. |
| 5,324,205 A | | 6/1994 | Ahmad et al. |
| 5,338,207 A | | 8/1994 | Lineberry et al. |
| 5,342,205 A | | 8/1994 | Hashiguchi |
| 5,358,412 A | | 10/1994 | Maurinus et al. |
| 5,388,998 A | | 2/1995 | Grange et al. |
| 5,395,252 A | | 3/1995 | White |
| 5,410,260 A | | 4/1995 | Kazama |
| 5,412,329 A | | 5/1995 | Iino et al. |
| 5,427,535 A | | 6/1995 | Sinclair |
| 5,437,556 A | | 8/1995 | Bargain et al. |
| 5,519,331 A | | 5/1996 | Cowart et al. |
| 5,521,519 A | | 5/1996 | Faure et al. |
| 5,548,488 A | | 8/1996 | Hansen |
| 5,637,539 A | | 6/1997 | Hofmann et al. |
| 5,645,433 A | | 7/1997 | Johnson |
| 5,652,608 A | | 7/1997 | Watanabe et al. |
| 5,653,598 A | | 8/1997 | Grabbe |
| 5,706,174 A | | 1/1998 | Distefano et al. |
| 5,723,347 A | | 3/1998 | Hirano et al. |
| 5,772,451 A | | 6/1998 | Dozier, II et al. |
| 5,795,172 A | | 8/1998 | Shahriari et al. |
| 5,829,988 A | | 11/1998 | McMillan et al. |
| 5,913,687 A | | 6/1999 | Rathburn |
| 5,920,765 A | | 7/1999 | Naum et al. |
| 5,923,178 A | | 7/1999 | Higgins et al. |
| 5,938,451 A | | 8/1999 | Rathburn |
| 5,947,749 A | | 9/1999 | Rathburn |
| 5,984,691 A | | 11/1999 | Brodsky et al. |
| 6,079,987 A | | 6/2000 | Matsunaga et al. |
| 6,094,115 A | | 7/2000 | Nguyen et al. |
| 6,135,783 A | | 10/2000 | Rathburn |
| 6,174,174 B1 | * | 1/2001 | Suzuki et al. ................. 439/71 |
| 6,178,629 B1 | | 1/2001 | Rathburn |
| 6,210,173 B1 | * | 4/2001 | Matsunaga .................. 439/66 |
| 6,231,353 B1 | | 5/2001 | Rathburn |
| 6,247,938 B1 | | 6/2001 | Rathburn |
| 6,294,920 B1 | | 9/2001 | Pfaff |
| 6,312,266 B1 | | 11/2001 | Fan et al. |
| 6,379,176 B1 | | 4/2002 | Ohsawa et al. |
| 6,384,475 B1 | * | 5/2002 | Beroz et al. ................ 257/690 |
| 6,409,521 B1 | | 6/2002 | Rathburn |
| 6,450,821 B2 | | 9/2002 | Otsuki et al. |
| 6,663,399 B2 | | 12/2003 | Ali et al. |
| 695,623 A1 | | 2/2004 | Brodsky |

FOREIGN PATENT DOCUMENTS

| | | |
|---|---|---|
| EP | 0 405 333 A2 | 1/1991 |
| EP | 0 431 566 A1 | 6/1991 |
| EP | 0 571 879 | 12/1993 |
| EP | 0 574 793 A1 | 12/1993 |
| EP | 0 310 302 B1 | 10/1994 |
| EP | 0 310 302 A3 | 10/1994 |
| EP | 0 817 319 A2 | 1/1998 |
| GB | 1 488 328 | 10/1977 |
| GB | 2 027 560 A | 2/1980 |
| GB | 2274212 | 7/1994 |
| WO | 98/13695 | 4/1998 |
| WO | 98/50985 | 11/1998 |
| WO | 00/46885 | 8/2000 |
| WO | 01/09980 A2 | 2/2001 |
| WO | 01/09980 A3 | 2/2001 |
| WO | 01/54232 A2 | 7/2001 |

* cited by examiner

FLEXIBLE COMPLIANT INTERCONNECT ASSEMBLY

This application claims the benefit of Prov. appl. No. 60/177,112 filed on Jan. 20, 2000.

FIELD OF THE INVENTION

The present invention is directed to a method and apparatus for achieving a compliant, solderless or soldered interconnect between a flexible circuit member and one or more other circuit members.

BACKGROUND OF THE INVENTION

The current trend in connector design for those connectors utilized in the computer field is to provide both high density and high reliability connectors between various circuit devices. High reliability for such connections is essential due to potential system failure caused by misconnection of devices. Further, to assure effective repair, upgrade, testing and/or replacement of various components, such as connectors, cards, chips, boards, and modules, it is highly desirable that such connections be separable and reconnectable in the final product.

Pin-type connectors soldered into plated through holes or vias are among the most commonly used in the industry today. Pins on the connector body are inserted through plated holes or vias on a printed circuit board and soldered in place using conventional means. Another connector or a packaged semiconductor device is then inserted and retained by the connector body by mechanical interference or friction. The tin lead alloy solder and associated chemicals used throughout the process of soldering these connectors to the printed circuit board have come under increased scrutiny due to their environmental impact. Additionally, the plastic housings of these connectors undergo a significant amount of thermal activity during the soldering process, which stresses the component and threatens reliability.

The soldered contacts on the connector body are typically the means of supporting the device being interfaced by the connector and are subject to fatigue, stress deformation, solder bridging, and co-planarity errors, potentially causing premature failure or loss of continuity. In particular, as the mating connector or semiconductor device is inserted and removed from the present connector, the elastic limit on the contacts soldered to the circuit board may be exceeded causing a loss of continuity. These connectors are typically not reliable for more than a few insertions and removals of devices. These devices also have a relatively long electrical length that can degrade system performance, especially for high frequency or low power components. The pitch or separation between adjacent device leads that can be produced using these connectors is also limited due to the risk of shorting.

Another electrical interconnection method is known as wire bonding, which involves the mechanical or thermal compression of a soft metal wire, such as gold, from one circuit to another. Such bonding, however, does not lend itself readily to high-density connections because of possible wire breakage and accompanying mechanical difficulties in wire handling.

An alternate electrical interconnection technique involves placement of solder balls or the like between respective circuit elements. The solder is reflown to form the electrical interconnection. While this technique has proven successful in providing high-density interconnections for various structures, this technique does not facilitate separation and subsequent reconnection of the circuit members.

An elastomeric material having a plurality of conductive paths has also been used as an interconnection device. The conductive elements embedded in the elastomeric sheet provide an electrical connection between two opposing terminals brought into contact with the elastomeric sheet. The elastomeric material must be compressed to achieve and maintain an electrical connection, requiring a relatively high force per contact to achieve adequate electrical connection, exacerbating non-planarity between mating surfaces. Location of the conductive elements is generally not controllable. Elastomeric connectors may also exhibit a relatively high electrical resistance through the interconnection between the associated circuit elements. The interconnection with the circuit elements can be sensitive to dust, debris, oxidation, temperature fluctuations, vibration, and other environmental elements that may adversely affect the connection.

The problems associated with connector design are multiplied when multiple integrated circuit devices are packaged together in functional groups. The traditional way is to solder the components to a printed circuit board, flex circuit, or ceramic substrate in either a bare die silicon integrated circuit form or packaged form. Multiship modules, ball grids, array packaging, and chip scale packaging have evolved to allow multiple integrated circuit devices to be interconnected in a group.

One of the major issues regarding these technologies is the difficulty in soldering the components, while ensuring that reject conditions do not exist. Many of these devices rely on balls of solder attached to the underside of the integrated circuit device which is then reflown to connect with surface mount pads of the printed circuit board, flex circuit, or ceramic substrate. In some circumstances, these joints are generally not very reliable or easy to inspect for defects. The process to remove and repair a damaged or defective device is costly and many times results in unusable electronic components and damage to other components in the functional group.

Many of the problems encountered with connecting integrated circuit devices to larger circuit assemblies are compounded in multi-chip modules. Multi-chip modules have had slow acceptance in the industry due to the lack of large scale known good die for integrated circuits that have been tested and burned-in at the silicon level. These dies are then mounted to a substrate, which interconnect several components. As the number of devices increases, the probability of failure increases dramatically. With the chance of one device failing in some way and effective means of repairing or replacing currently unavailable, yield rates have been low and the manufacturing costs high.

BRIEF SUMMARY OF THE INVENTION

The present invention is directed to a method and apparatus for achieving a fine pitch interconnect between a flexible circuit member and one or more circuit members with co-planar electrical contacts that have a large range of compliance. The connection with the circuit members can be soldered or solderless. The circuit member can be a printed circuit board, another flexible circuit, a bare-die device, an integrated circuit device, an organic or inorganic substrate, a rigid circuit and virtually any other type of electrical component. The present invention is also directed to an electrical interconnect assembly comprising one or more flexible circuit members electrically coupled to a plurality of circuit members.

In one embodiment, the compliant interconnect assembly comprises a substrate and at least one flexible circuit member having a first surface with a plurality of first contact pads and a second surface. A compliant material is interposed between the substrate and the second surface of the flexible circuit member. The compliant material is aligned with one or more of the first contact pads to bias first contact pads away from the substrate when the first surface of the flexible circuit member is compressed against the substrate.

The substrate can be one of a printed circuit board, a flexible circuit, a bare die device, an integrated circuit device, a carrier, organic or inorganic substrates, a compliant material, or a rigid circuit. The compliant material can optionally be attached to the substrate or the flexible circuit member. In one embodiment, the compliant material comprises a first modulus of elasticity and the substrate comprises a compliant material having a second modulus of elasticity different from the first modulus of elasticity.

A first circuit member having contact pads can be aligned with the first contact pads on the first surface of the flexible circuit member and compressively engaged with the compliant interconnect assembly so that the compliant material bias the first contact pads against corresponding contact pads on the first circuit member. One or more of the first contact pads on the flexible circuit member can be singulated contact pads. One or more locations of weakness can be formed in one or more of the first contact pads. In one embodiment, a second circuit member comprising a ball grid array is snap-fit with the first contact pads on the flexible circuit member. In another embodiment, the compliant material comprises a spring member. The flexible circuit member typically includes second contact pads located on the second surface.

In some embodiments, a portion of the flexible circuit member extends beyond the compliant interconnect assembly. A bare die device can be bonded to the portion of the flexible circuit member extending beyond the compliant interconnect assembly. Alternatively, a second compliant interconnect assembly can electrically couple that portion of the flexible circuit member with a second circuit member. In one embodiment, the flexible circuit member electrically couples with a second circuit member so that the first circuit member, the second circuit member and the substrate comprise a stacked configuration.

The first contact pads can optionally have conductive structures adapted to electrically couple with contact pads on a first circuit member. The structures can have a shape complementary to a shape of the contact pads on the first circuit member. The contact pads on the flexible circuit member can be adapted to engage with a connector member selected from the group consisting of a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), or packaged or unpackaged integrated circuits.

In another embodiment, the compliant interconnect assembly includes a substrate having first and second surfaces, and a plurality of holes. One or more regions of raised compliant material are located on the substrate. A first flexible circuit member having a first surface with a plurality of first contact pads and a second surface with a plurality of second contact pads is provided. The first surface of the substrate is located along a second surface of the first flexible circuit member with the raised compliant material aligned with the first contact pads and the holes in the substrate aligned with the second contact pads. A second flexible circuit member having a first surface with a plurality of first contact pads and a second surface with a plurality of second contact pads is optionally provided. The first surface of the second flexible circuit member is located along the second surface of the substrate so that the first contact pads of the second flexible circuit member are aligned with the holes in the substrate. The second contact pads on the first flexible circuit member and the first contact pads on the second flexible circuit members are preferably electrically coupled through the holes in the substrate.

The present invention is also directed to an electrical assembly comprising one or more circuit members compressively engaged with the compliant interconnect assembly so that the raised compliant material biases the contact pads on the flexible circuit member with corresponding contact pads on the circuit members.

The present invention is also directed to an electrical assembly comprising a plurality of compliant raised portions located on a first circuit member. A flexible circuit member having a first surface with a plurality of contact pads and a second surface with a plurality of contact pads is provided. The contact pads on the first surface are bonded to contact pads on the first circuit member and the raised compliant material is aligned with the contact pads on the second surface of the flexible circuit member.

The present invention is also directed to a method of making a compliant interconnect. In one embodiment, a substrate is prepared with a first array of through holes. A masking material is applied to the substrate. A second array of through holes is created through the masking material and substrate. A compliant material is applied to the second array of through holes. The masking material is removed to expose an array of compliant raised portions.

In another embodiment, a masking material is applied to the substrate. An array of through holes is created through the masking material and substrate. A compliant material is applied to the an-ay of through holes. The masking material is removed to expose an array of compliant raised portions.

The present invention is also directed to a method of making a compliant interconnect assembly comprising the steps of aligning contact pads on a circuit member with the contact pads on the first surface of the flexible circuit member and compressing the circuit member with the compliant interconnect assembly.

DETAILED DESCRIPTION OF THE INVENTION

Figure 4:
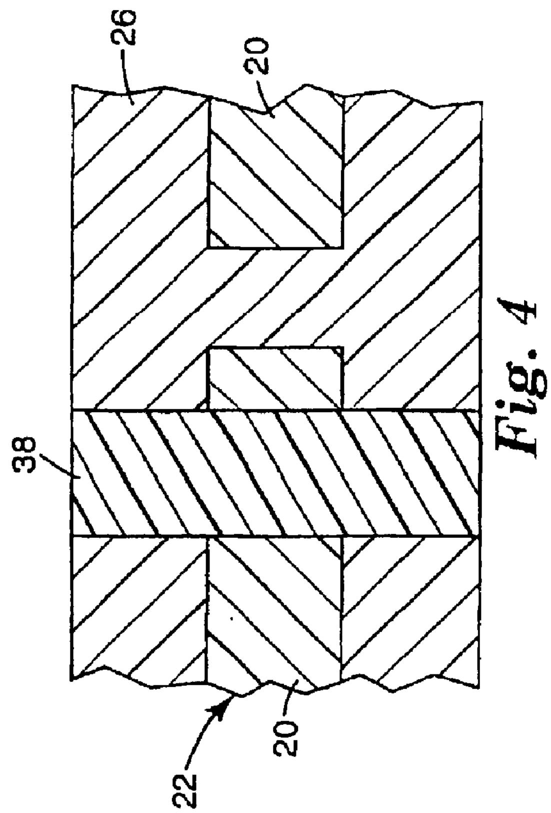
FIG. 4 is a side sectional view of a compliant material applied to the substrate of FIG. 3.
Figure 1:
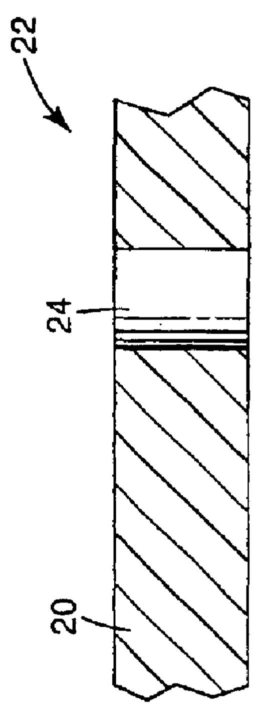
FIG. 1 is a substrate used for making a compliant interconnect in accordance with the present invention.
Figure 5:
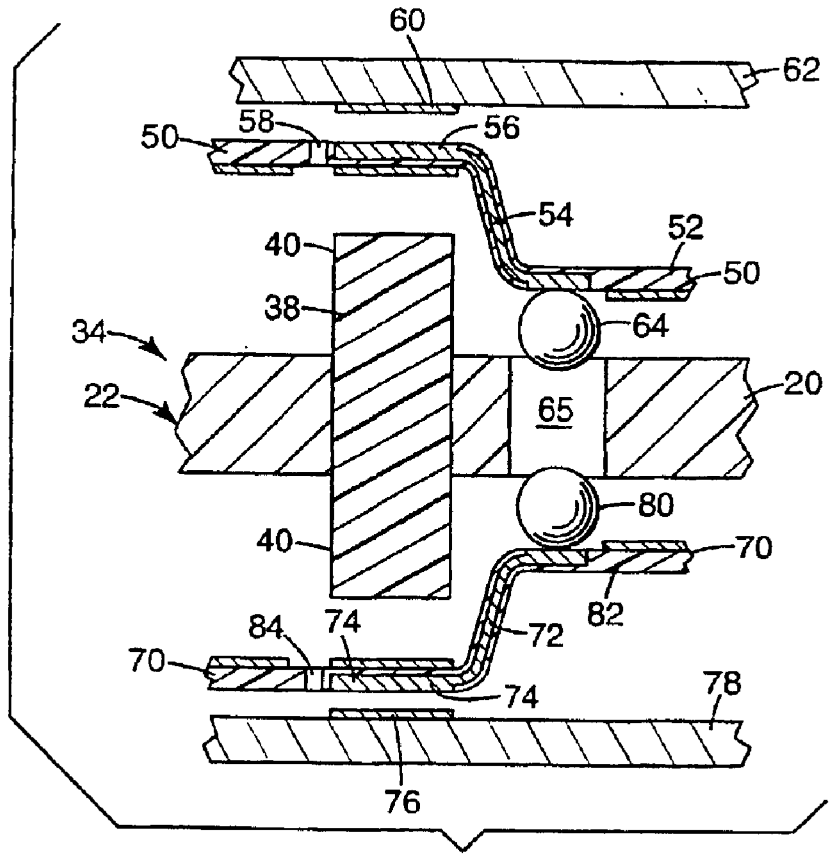
FIG. 5 is a side sectional view of a compliant interconnect assembly in accordance with the present invention.

FIGS. 1–4 illustrate a method of preparing a compliant interconnect 22 in accordance with the present invention (see FIG. 5). The Figures disclosed herein may or may not be drawn to scale. The substrate 20 is perforated to include one or more through holes 24. The holes 24 can be formed by a variety of techniques, such as molding, stamping, laser drilling, or mechanical drilling. The holes 24 can be arranged in a variety of configurations, including one or two-dimensional arrays. As will be discussed below, some embodiments do not require the holes 24. The substrate 20 is typically constructed from a dielectric material, such as plastics, ceramic, or metal with a non-conductive coating. In some of the embodiments discussed below, an electrically active circuit member (see FIG. 11) is substituted for the electrically inactive substrate 20.

Figure 2:
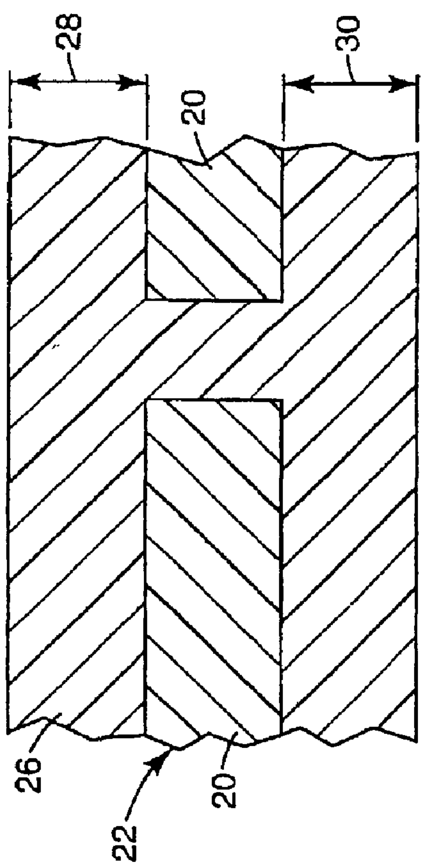
FIG. 2 is a side sectional of the substrate of FIG. 1 with a masking material applied in accordance with the present invention.
Figure 3:
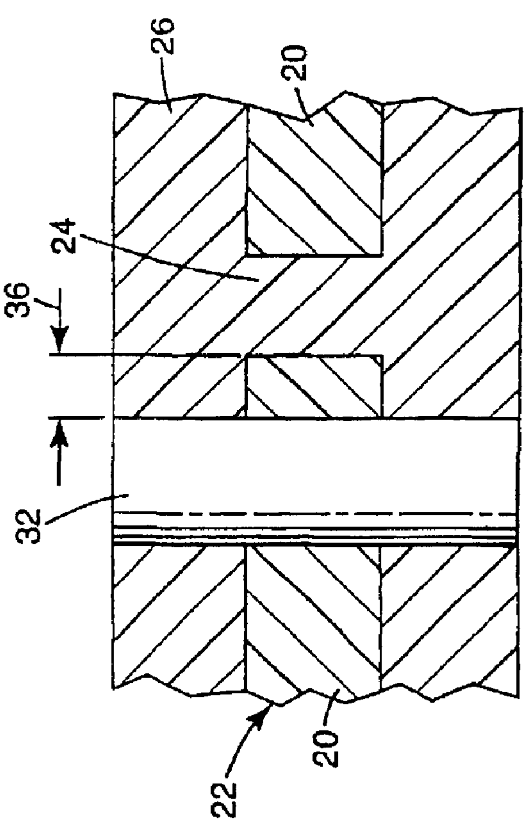
FIG. 3 is a side sectional view of the substrate and masking material of FIG. 2 with an additional hole in accordance with the present invention.

As illustrated in FIG. 2, the substrate 20 is then flooded with one or more masking materials 26, such as a solder mask or other materials. Through careful application and/or subsequent processing, such as planarization, the thickness of the masking material at locations 28, 30 is closely controlled for reasons that will become clearer below. The additional holes 32 shown in FIG. 3 are then drilled or perforated in the substrate 20 and masking material 24 at a predetermined distance 36 from the existing through hole 24. While there is typically a hole 32 adjacent each of the holes 24, there is not necessarily a one-to-one correlation. The holes 32 can be arranged in a variety of configurations, which may or may not correlate to the one or two-dimensional array of holes 24.

The holes 32 are then filled with a compliant material 38, as shown in FIG. 4. The thickness of the compliant material 38 is typically determined by the thickness of the masking material 26. Suitable compliant materials include elastomeric materials such as Sylgard™ available from Dow Corning Silicone of Midland, Mich. and MasterSyl '713, available from Master Bond Silicone of Hackensack, N.J.

The compliant interconnect 22 of FIGS. 2–4 can optionally be subjected to a precision grinding operation, which results in very flat surfaces, typically within about 0.0005 inches. The grinding operation can be performed on both sides at the same time using a lapping or double grinding process. In an alternate embodiment, only one surface of the compliant interconnect 22 is subject to the planarization operation. The present method permits the accurate manufacture of raised portions 40 having virtually any height.

Once the compliant encapsulant 38 is cured, the masking material 26 is removed to yield the compliant interconnect 22 illustrated in FIG. 5. The compliant interconnection 22 illustrated in FIG. 5 includes the substrate 20, one or more raised portions 40 of the compliant encapsulant 38 extending above the substrate 20, and the through holes 24. As used herein, "compliant interconnect" refers to a substrate with one or more compliant raised portions extending above a surface of the substrate. The substrate can be a carrier or a circuit member, such as a printed circuit board, a flexible circuit, a bare die device, an integrated circuit device, organic or inorganic substrates, or a rigid circuit. The through holes are optionally added for some applications.

FIG. 5 illustrates a compliant interconnect assembly 34 in accordance with the present invention. The compliant interconnect assembly 34 includes the compliant interconnect 22 and one or more flexible circuit members 50, 70. The first flexible circuit member 50 is located along one surface of the compliant interconnect 22. The first flexible circuit member 50 includes a polymeric sheet 52 and a series of electrical traces 54. In the embodiment illustrated in FIG. 5, the traces 54 terminate at a contact pad 56. The electrical trace 54 terminates in a solder ball 64. The contact pad 56 is positioned to engage with a contact pad 60 on a first circuit member 62. The solder ball 64 is positioned adjacent to through hole 65. As used herein, "circuit member" refers to a printed circuit board, a flexible circuit, a packaged or unpackaged bare die silicon device, an integrated circuit device, organic or inorganic substrates, a rigid circuit, or a carrier (discussed below).

The region of the polymeric sheet 52 adjacent to the contact pad 56 includes singulation 58. The singulation 58 is a partial separation of the terminal from the sheet 52 that does not disrupt the electrical integrity of the conductive trace 54. In the illustrated embodiment, the singulation 58 is a slit surrounding a portion of the contact pad 56. The slit may be located adjacent to the perimeter of the contact pad 56 or offset therefrom. The singulated flexible circuit members 50, 70 control the amount of force, the range of motion, and assist with creating a more evenly distributed force vs. deflection profile across the array.

As used herein, a singulation can be a complete or partial separation or a perforation in the polymeric sheet. Alternatively, singulation may include a thinning or location of weakness of the polymeric sheet along the edge of, or directly behind, the contact pad. The singulation releases or separates the contact pad from the polymeric sheet, while maintaining the interconnecting circuit traces.

The singulations can be formed at the time of manufacture or the polymeric sheet can be subsequently patterned by stamping, cutting or a variety of other techniques. In one embodiment, a laser system, such as Excimer, $CO_2$, or YAG, creates the singulation. This structure is advantageous in several ways, where the force of movement is greatly reduced since the flexible circuit member is no longer a continuous membrane, but a series of flaps or bond sites with a living hinge and bonded contact (see for example FIG. 10).

The second flexible circuit member 70 is likewise positioned on the opposite side of the compliant interconnect 22. Electrical trace 72 is electrically coupled to contact pad 74 positioned to engage with a contact pad 76 on a second circuit member 78. Solder ball 80 is located on the opposite end of the electrical trace 72. Polymeric sheet 82 of the second flexible circuit member 70 also includes a singulation 84 adjacent to the contact pad 74.

The contact pads 56, 74 can be part of the base laminate of the flexible circuit members 50, 70, respectively. Alternatively, discrete contact pads 56, 74 can be formed separate from the flexible circuit members 50, 70 and subsequently laminated or bonded in place. For example, an array of contact pads 56, 74 can be formed on a separate sheet and laminate to the flexible circuit members 50, 70. The laminated contact pads 56, 74 can be subsequently processed to add structures (see FIG. 20) and/or singulated.

The contact pads 60, 76 may be a variety of structures such as, for example, a ball grid array, a land grid array, a pin grid array, contact points on a bare die device, etc. The contact pads 60, 76 can be electrically coupled with the compliant interconnect assembly 34 by compressing the components 62, 78, 34 together (solderless), by reflowing solder or solder paste at the electrical interface, by conductive adhesive at the electrical interface, or a combination thereof.

Figure 6:
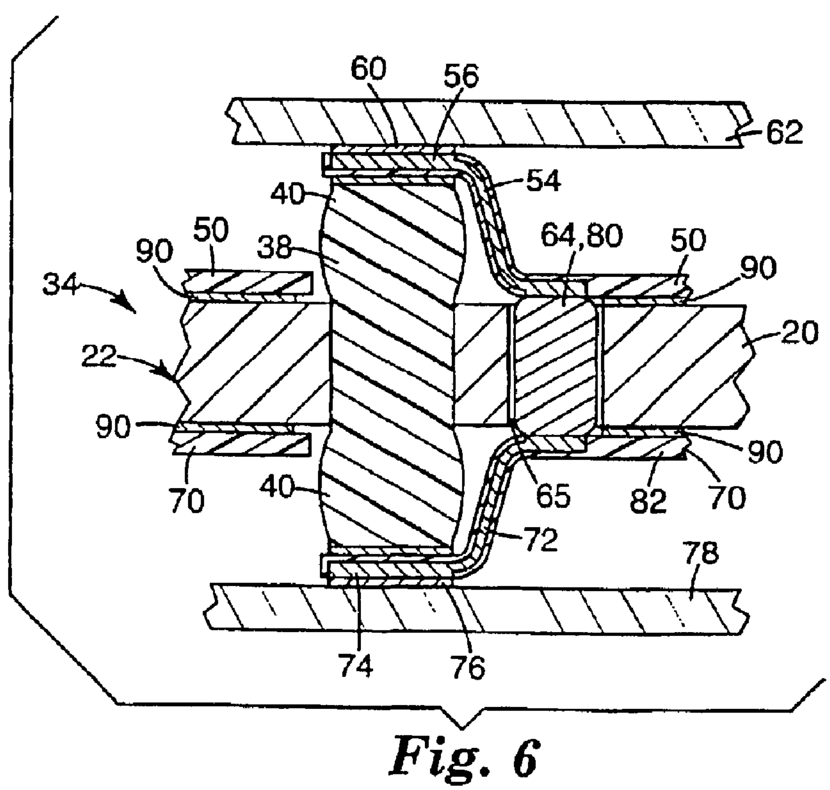
FIG. 6 is a side sectional view of the compliant interconnect assembly of FIG. 5 in a compressed state in accordance with the present invention.

As illustrated in FIG. 6, the first and second flexible circuit members 50, 70 are compressed against the compliant interconnect assembly 34. The solder balls 64, 80 are reflown and create an electrical connection between the first and second flexible circuit members 50, 70, generally within through hole 65. Adhesive 90 may optionally be used to retain the first and second flexible circuit members 50, 70 to the substrate 20. Contact pads 56, 74 are abutted against raised portion 40 of the compliant material 38.

The singulations 58, 84 permit the raised portions 40 to push the contact pads 56, 74 above the surface of the substrate 20, without damaging the first and second flexible circuit members 50, 70, respectively. The raised portion 40 also deforms outward due to being compressed. The contact pads 56, 74 may optionally be bonded to the raised compliant material 40. The raised compliant material 40 supports the flexible circuit members 50, 70, and provides a contact force that presses the contact pads 56, 74 against the contact pads 60, 76 as the first and second circuit members 62, 78, respectively are compressed against the compliant interconnect assembly 34. The movement of the contact pads 56, 74 is controlled by the raised portion 40 of the compliant material 38 and the resiliency of the flexible circuit members 50, 70. These components are engineered to provide a desired level of compliance. The raised portions 40 provide a relatively large range of compliance of the contact pads 56, 74. The nature of the flexible circuit members 50, 70 allow fine pitch interconnect and signal escape routing, but also inherently provides a mechanism for compliance.

Figure 7:
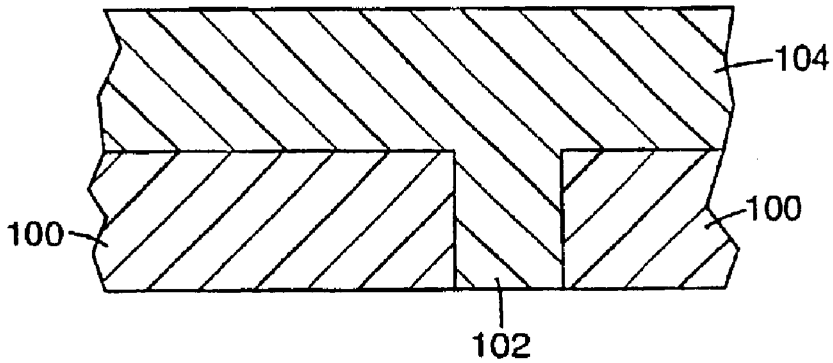
FIGS. 7–9 are side sectional views of an alternate compliant interconnect in accordance with the present invention.
Figure 8:
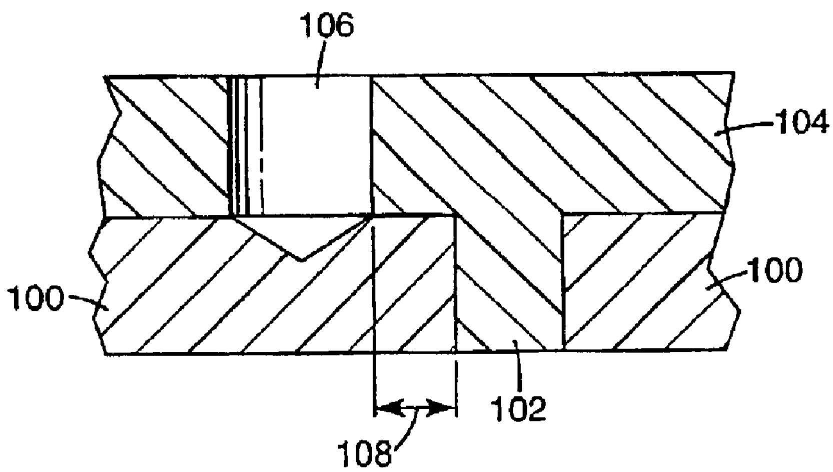

FIG. 7 illustrates an alternate substrate 100 with an array of through holes 102. In the illustrated embodiment, masking material 104 is applied to only one surface of the substrate 100 and the through hole 102. Additional holes 106 are prepared in the masking material 104 and substrate 100 a fixed distance 108 from the hole 102, as illustrated in FIG. 8. The hole 106 is only drilled partially into the substrate 100. A compliant material 110 is then deposited in the hole 106. After the masking material 104 is removed, the resulting compliant interconnect 112 includes a raised compliant material only on one surface (see generally FIG. 11).

Figure 10A:
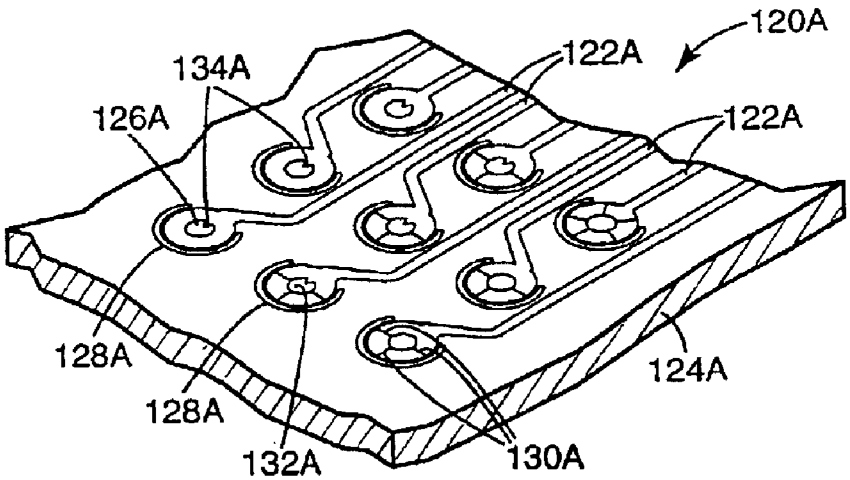
FIG. 10A is a perspective view of a flexible circuit member in accordance with the present invention.

FIG. 10A is a perspective view of a flexible circuit member 120A suitable for use in the present invention. The flexible circuit member 120A includes a series of electrical traces 122A deposited on a polymeric sheet 124A and terminating at an array of contact pads or terminals 126A. As used herein terminal refers to an electrical contact location or contact pad. In the illustrated embodiment, the terminals 126A include a singulation 128A. The degree of singulation 128A can vary depending upon the application. For example, in some embodiments the flexible circuit member 120A stretches in order to comply with the raised portions. In other embodiments a greater degree of singulation minimizes or eliminates stretching of the flexible circuit member 120A due to engagement with the raised portions.

In some embodiments, the terminals 126A include one or more locations of weakness 130A. As used herein, "locations of weakness" include cuts, slits, perforations or frangible portions, typically formed in the polymeric sheet 124A and/or a portion of the electrical trace 122A forming the terminal 126A. The locations of weakness facilitate interengagement of an electrical contact, such as a ball contact on a BGA device, with the terminal 126A (see FIG. 19). The terminals 126A can optionally include an aperture 132A to further facilitate engagement with an electrical contact. In another embodiment, a portion 134A of the trace 122A protrudes into the aperture 132A to enhance electrical engagement with the electrical contact In other embodiments, a compliant raise portion is attached to the rear of the flexible circuit member 120A opposite the terminal 126A (see FIG. 11). When the flexible circuit member 120A is pressed against a surface (such as a printed circuit board), the raised compliant material lifts the singulated terminal 126A away from the surface.

Figure 10B:
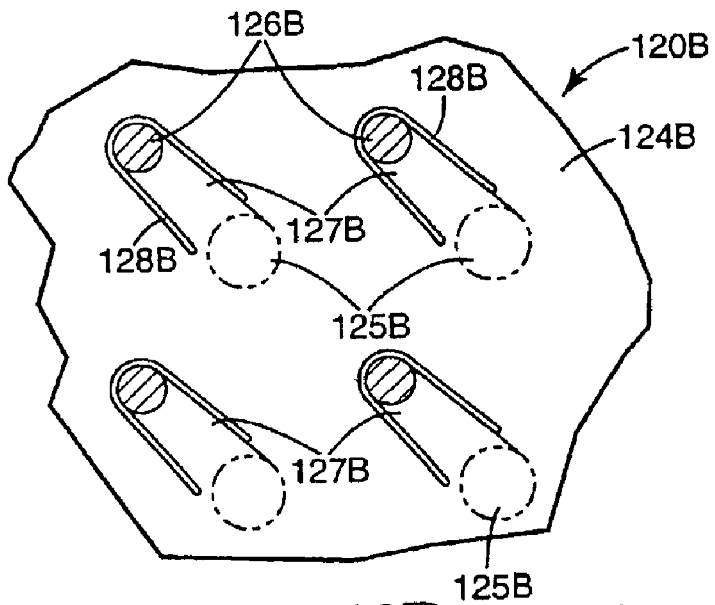
FIG. 10B is a perspective view of an alternate flexible circuit member in accordance with the present invention.

FIG. 10B is a top plan view of an alternate flexible circuit member 120B with an elongated singulation 128B. Contact pads 126B are located on the top of the polymeric sheeting 124B and the solder ball bonding sites 125B are located on the bottom. The contact pads 126B are offset from the solder ball-bonding site 125B by the portion 127B of the polymeric sheeting 124B. An electrical trace can optionally connect the contact pads 125B with the contact pads 126B along the portion 127B. The portion 127B permits the contact pads 126B to be raised up or deflected from the flexible circuit member 120B in order to comply with the motion of the flexure (see for example FIGS. 11–15) with minimal or no deformation or stretching of the surrounding polymeric sheeting 124B. The contact pads 126B can optionally include locations of weakness.

Figure 10C:
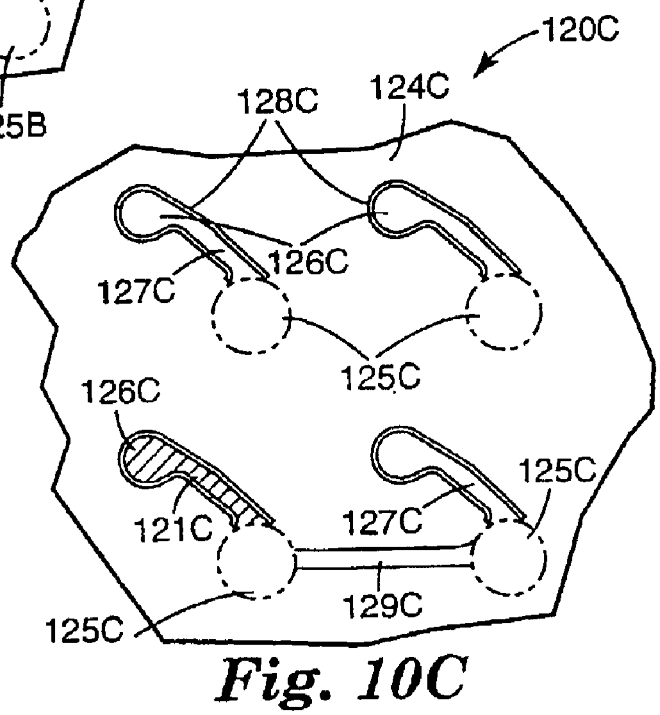
FIG. 10C is a perspective view of another alternate flexible circuit member in accordance with the present invention.

FIG. 10C is a top plan view of an alternate flexible circuit member 120C with an irregularly shaped singulation 128C. Contact pads 126C are located on the top of the polymeric sheeting 124C and the solder ball bonding sites 125C are located on the bottom. The contact pads 126C are offset from the solder ball-bonding site 125C by the irregularly shaped portion 127C of the polymeric sheeting 124C. The shape of the portion 127C determines the force required to raise up or deflect the contact pads 126C from the flexible circuit member. 120C in order to comply with the motion of the flexure (see for example FIGS. 11–15). Again, minimal or no deformation or stretching of the surrounding polymeric sheeting 124C is experienced. An electrical trace 121C can optionally connect some of the contact pads 125C with the contact pads 126C along the portion 127C. Additionally, trace 129C can connect two or more contact pads 125C, such as for a common ground plane.

Figure 11:
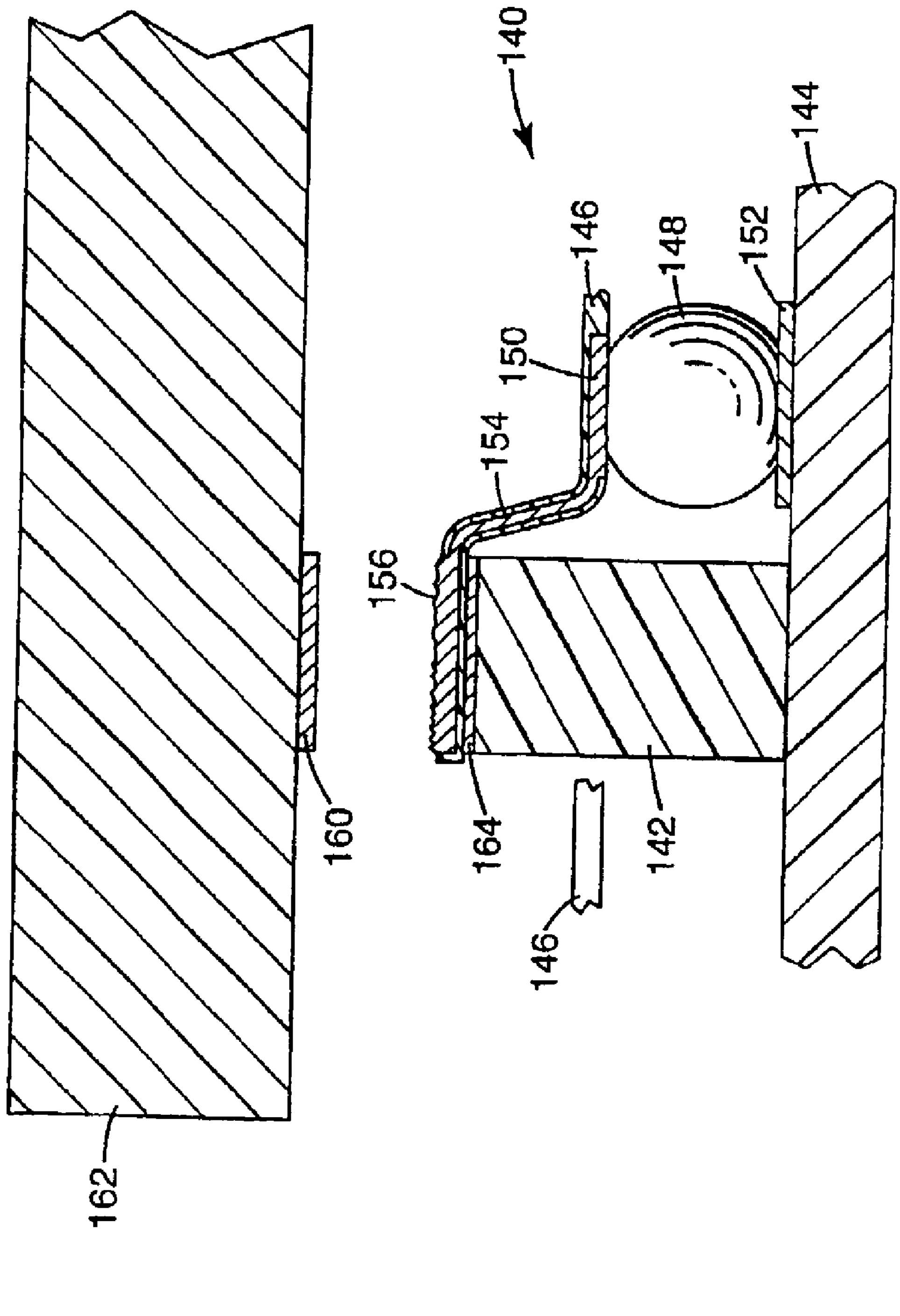
FIG. 11 is a side sectional view of a compliant interconnect assembly in accordance with the present invention.

FIG. 11 is a sectional view of an alternate compliant interconnect assembly 140 in accordance with the present invention. The raised compliant material 142 is formed directly on second circuit member 144, which in the embodiment of FIG. 11 is a printed circuit board. In an alternate embodiment, the raised compliant material 142 are formed separate from the second circuit member 144 and subsequently bonded thereto using a suitable adhesive or other bonding technique. In another embodiment, the raised portion 142 is formed on, or bonded to, the rear of flexible circuit member 146. In the illustrated embodiment, the printed circuit board 144 serves the function of both the substrate 20 and the second circuit member 78 illustrated in FIG. 5. The embodiment of FIG. 11 does not require through holes in the circuit member 144.

Flexible circuit member 146 includes a solder ball 148 that is typically reflown to electrically couple bonding pad 150 to the contact pad 152 on the circuit board 144. Alternatively, solder paste can be applied to both the bonding pad 150 and the contact pad 152. Electrical trace 154 electrically couples the solder bonding pad 150 to contact pad 156. Contact pad 156 may optionally include a rough surface to enhance the electrical coupling with the contact pad 160 on the first circuit member 162. The flexible circuit member 146 is singulated so that the raised compliant material 142 lifts the contact pad 156 away from the circuit member 144. When the circuit member 162 is compressed against the compliant interconnect assembly 140, the raised compliant material 142 biases the contact pad 156 against the first circuit member 162. In the compressed state, the compliant interconnect assembly 140 can have a height of about 0.3 millimeters or less. Alternatively, the contact pad 160 can be electrically coupled with the contact pad 156 by reflowing solder or solder paste at the electrical interface, by conductive adhesive at the electrical interface, or either of the above in combination with compression.

The raised compliant material 142 can optionally be doped or filled with rigid or semi-rigid materials to enhance the integrity of the electrical contact created with the contact pad 160 on the first circuit member 162. Bonding layer 164 is optionally provided to retain the contact pad 156 to the raised compliant material 142.

Figure 9:
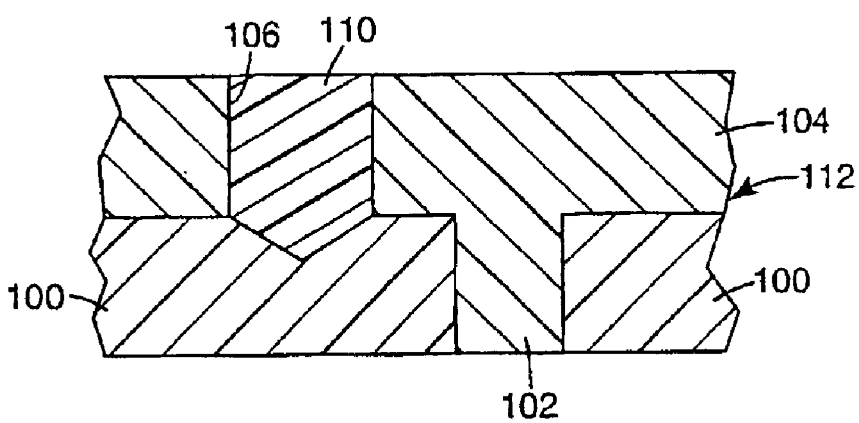
Figure 12A:
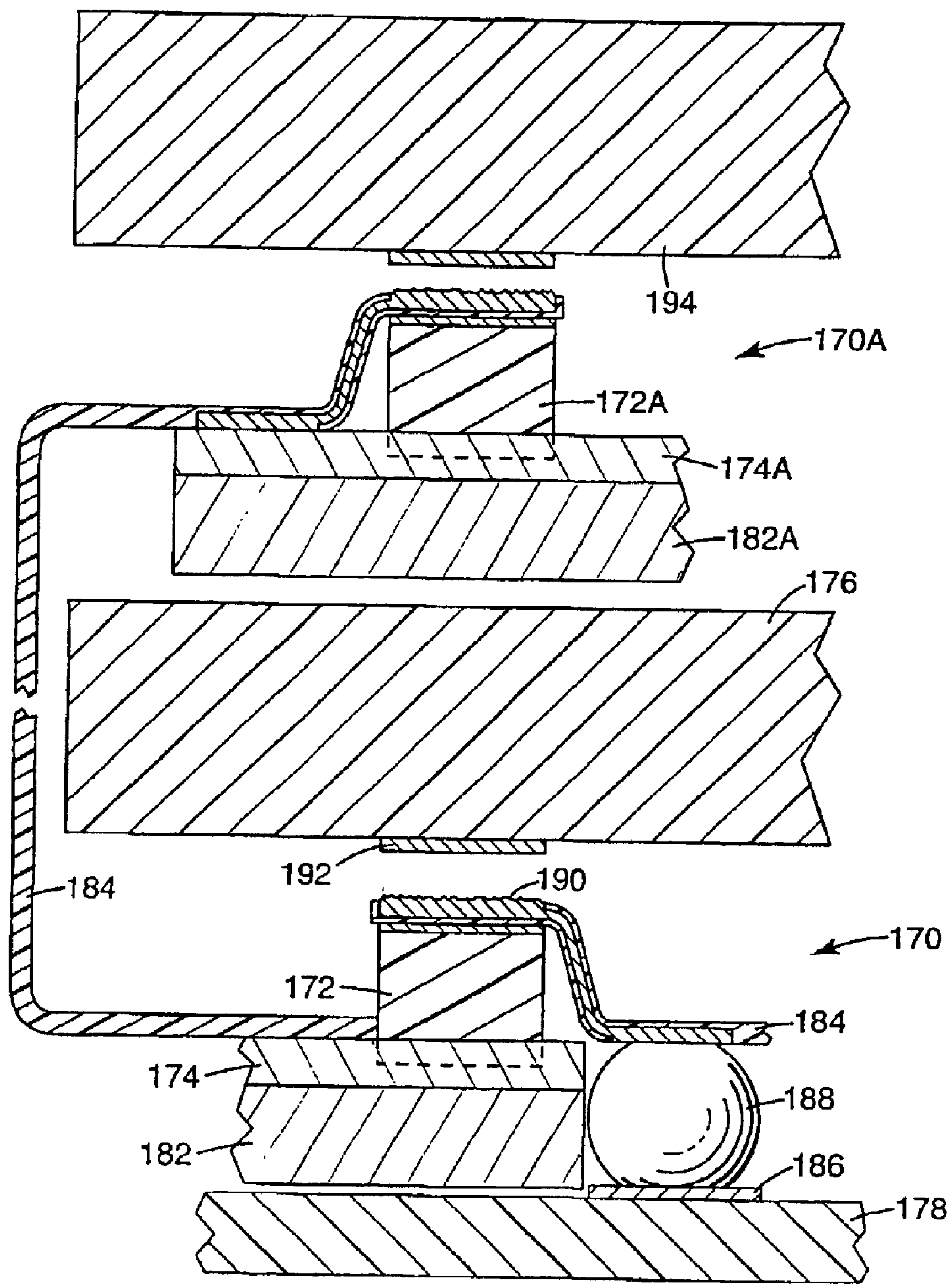
FIG. 12A is a side sectional view of an alternate compliant interconnect assembly in a stacked configuration in accordance with the present invention.

FIG. 12A illustrates an alternate compliant interconnect assembly 170 using a compliant interconnect generally as illustrated in FIGS. 7–9. Raised compliant material 172 is attached to a carrier 174 that is interposed between first and second circuit members 176, 178. The carrier 174 can be rigid or flexible. An additional support layer 182 can optionally be added to the carrier 174 to increase rigidity and/or compliance. In one embodiment, the raised compliant material 172 has a first modulus of elasticity and the additional support layer 182 has a second modulus of elasticity different from the first modulus of elasticity. In another embodiment, the raised compliant material 172 is attached to the rear surface of flexible circuit member 184.

Flexible circuit member 184 is electrically coupled to the contact pad 186 on second circuit member 178 by solder ball or solder paste 188. When the first circuit member 176 is compressively engaged with the compliant interconnect assembly 170, raised compliant material 172 biases contact pad 190 on the flexible circuit member 184 against contact pad 192 on the first circuit member 176. In an embodiment where the carrier 174 has compliant properties, the combined compliant properties of the carrier 174 and raised compliant material 172 provides the bias force.

In another embodiment, the flexible circuit member 184 extends to a second interconnect assembly 170A. Any of the interconnect assemblies disclosed herein can be used as the interconnect assembly 170A. In the illustrated embodiment, raised compliant material 172A is attached to a carrier 174A that is interposed between first circuit members 176 and a third circuit member 194. The carrier 174A can be rigid or flexible. An additional support layer 182A can optionally be added to the carrier 174A to increase rigidity and/or compliance. The third circuit member 194 can be an integrated circuit device, such as the LGA device illustrated in FIG. 12A, a PCB or a variety of other devices. The entire assembly of circuit members 176, 178, 194 can be stacked together and the solder then mass reflowed during final assembly.

Figure 12B:
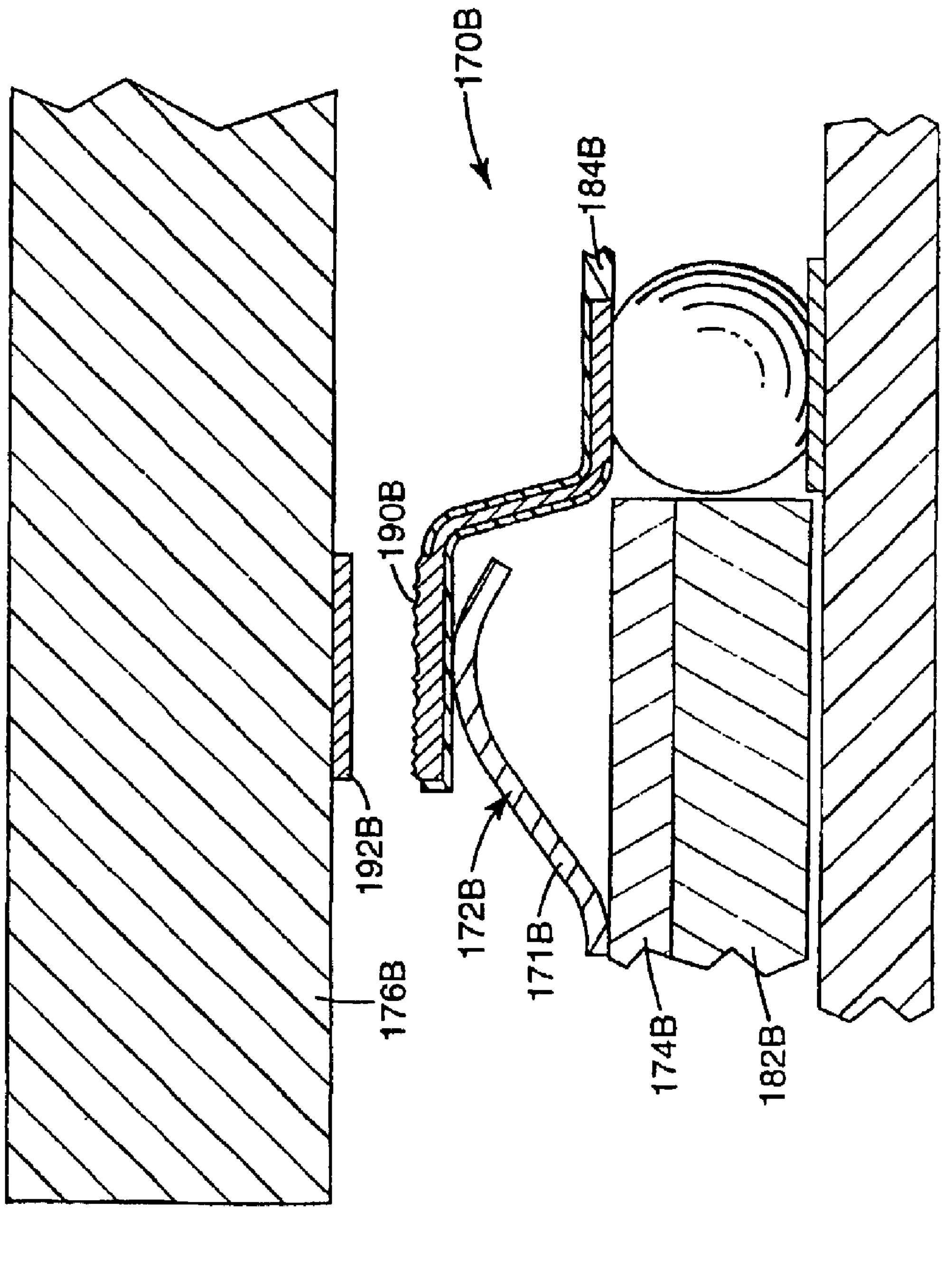
FIG. 12B is a side sectional view of an alternate compliant interconnect assembly with a spring member in accordance with the present invention.

FIG. 12B illustrates an alternate compliant interconnect assembly 170B generally as illustrated in FIG. 12A, except that the raised compliant material 172B attached to a carrier 174B is an elongated compliant member 171B. The compliant member 171B can be spring member or a rigid member attached to a compliant carrier 174B, such as a beryllium copper spring. An additional support layer 182B can optionally be added to the carrier 174B to increase rigidity and/or compliance. The compliant members 171B provide reactive support to urge the contact pad 190B on the flexible circuit member 184B against the contact pad 192B on the first circuit member 176B. The compliant member 171B can be formed in the carrier 174B or formed separately and attached thereto. The compliant member 171B can alternatively be a coil spring or a variety of other structures.

Figure 12C:
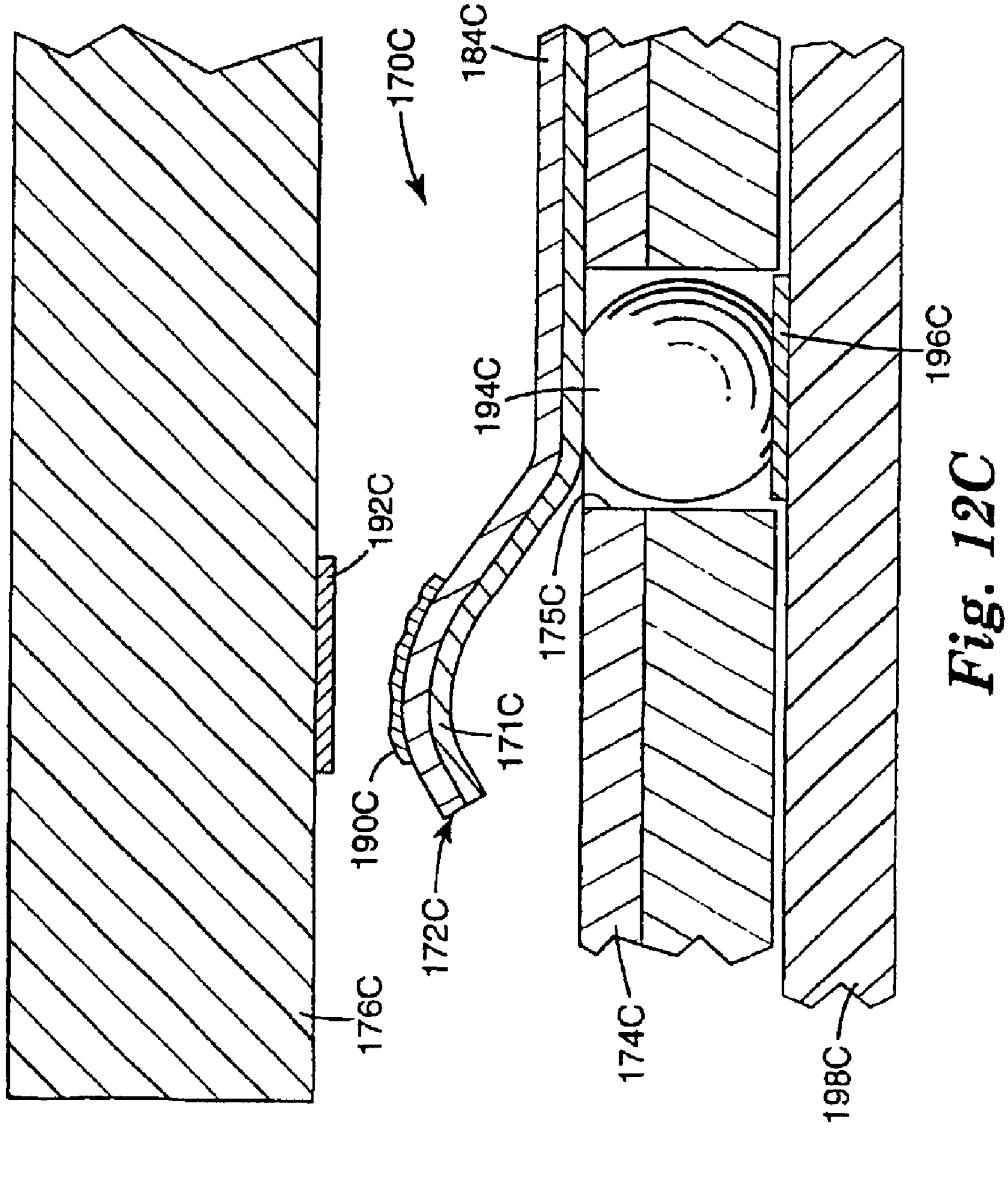
FIG. 12C is a side sectional view of an alternate compliant interconnect assembly with a sheet of spring members in accordance with the present invention.

FIG. 12C illustrates another alternate compliant interconnect assembly 170C generally as illustrated in FIG. 12B, except that the raised compliant material 172C is an elongated compliant member 171C supporting the flexible circuit member 184C. Rigid substrate 174C includes a series of compliant spring members 171C positioned under the flexible circuit member 184C. The upper surface of the flexible circuit member 184C is patterned with a series of rough contact pads 190C. The lower surface of the flexible circuit member 184C is prepared to receive solder paste or solder ball 194C. The rigid substrate 174C also includes a series of solder deposit alignment openings 175C through which solder ball 194C can couple the lower surface of the flexible circuit member 184C with second circuit member 198C. The compliant members 171C provide reactive support to bias the flexible circuit member 184C against contact pad 192C on first circuit member 176C.

Figure 13:
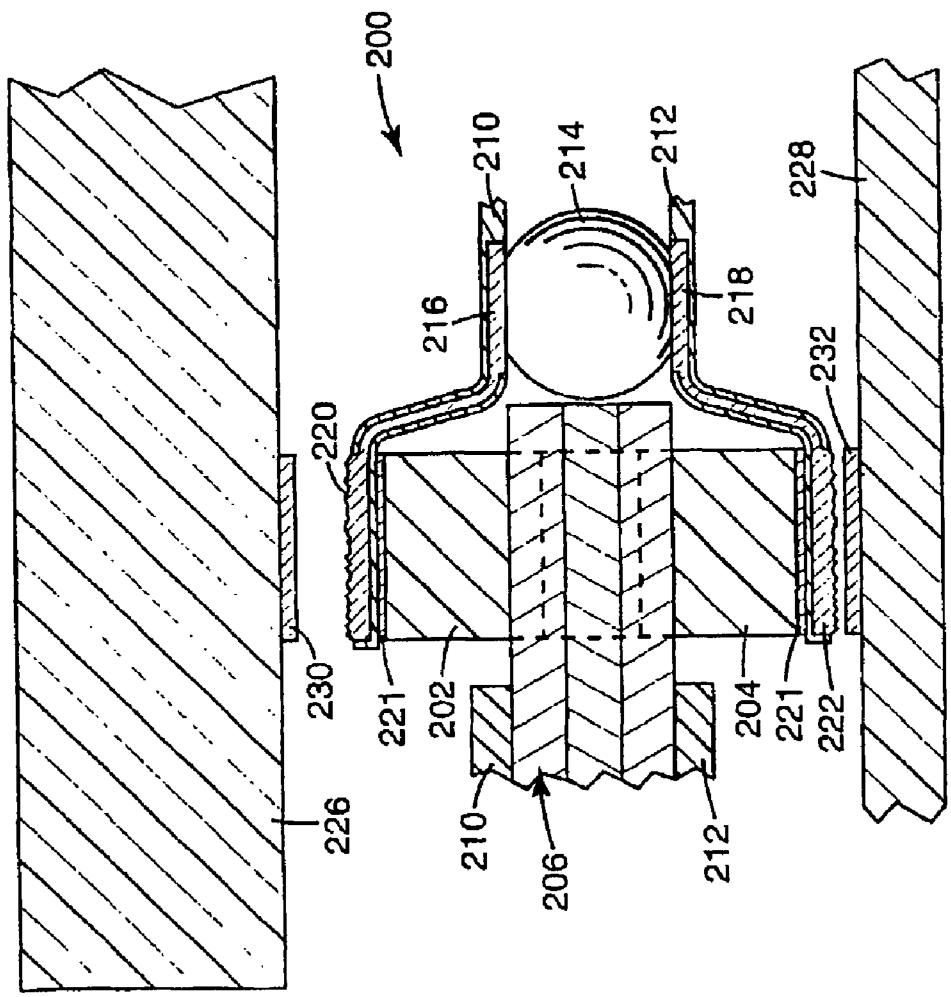
FIG. 13 is a side sectional view of an alternate compliant interconnect assembly with a carrier in accordance with the present invention.

FIG. 13 illustrates an alternate compliant interconnect assembly 200 in accordance with the present invention. A pair of discrete compliant raised portions 202, 204 are attached to a carrier 206. In the illustrated embodiment, the carrier 206 is a multilayered structure. First and second flexible circuit members 210, 212 are positioned on opposite sides of the compliant interconnect assembly 200, generally as illustrated in FIG. 6. Solder ball 214 connects solder ball pads 216, 218 on the respective flexible circuit members 210, 212. The solder ball 214 can be replaced by a variety of connection methods such as wedge bonding, ultrasonic bonding, resistance bonding, wire bonding, or iso-tropic/anisotropic conductive adhesives.

Contact pads 220, 222 on the respective flexible circuit members 210, 212 are singulated. Adhesive 221 can optionally be used to bond contact pads 220, 222 to the raised compliant material 202, 204. The flexible circuit members 210, 212 can optionally be bonded to the carrier 206. The resulting compliant interconnect assembly 200 is interposed between first and second circuit members 226, 228 in a compressive relationship so that contact pads 220, 222 are compressively engaged with respective contact pads 230, 232.

Figure 14A:
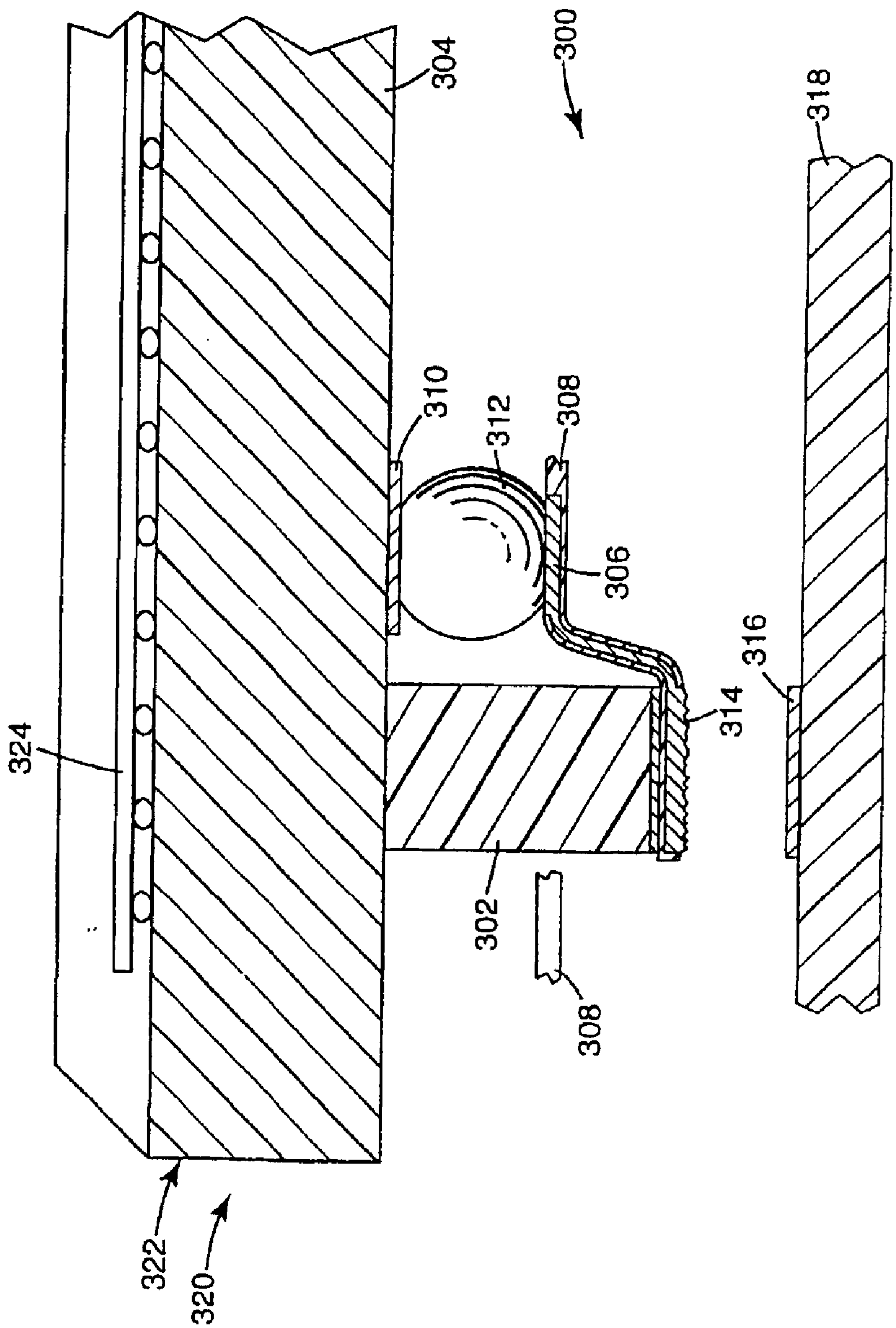
FIG. 14A is a side sectional view of a compliant interconnect assembly on an integrated circuit device in accordance with the present invention.

FIG. 14A illustrates an alternate compliant interconnect assembly 300 in accordance with the present invention. The raised compliant material 302 is located on the first circuit member 304. The raised compliant material 302 can be bonded to both the first circuit member 304 and the rear of contact pad 314. In the illustrated embodiment, the first circuit member 304 is a packaged integrated circuit device. The first circuit member 304 can alternately be a printed circuit board, another flexible circuit, a bare-die device, an integrated circuit device, an organic or inorganic substrate, a rigid circuit and virtually any other type of electrical component. Solder ball pad 306 on the flexible circuit member 308 is electrically coupled to contact pad 310 on the first circuit device 304 by solder ball 312. Contact pad 314 on the flexible circuit member 308 is supported by raised compliant material 302. The contact pad 314 can be compressively engaged with pad 316 on the second circuit member 318.

In an alternate embodiment, FIG. 14A illustrates a connector-on-package 320 in accordance with the present invention. The first circuit device 304 forms a substrate for package 322 containing bare die device 324. In the illustrated embodiment, the bare die device 324 is a flip chip and/or wire bond integrated circuit structure, although any packaged integrated circuit device can be used in the present connector on package 320 embodiment. The compliant interconnect assembly 300 is formed on the substrate 304 as discussed above, yielding a packaged integrated circuit 324 with an integral connector 300.

Figure 14B:
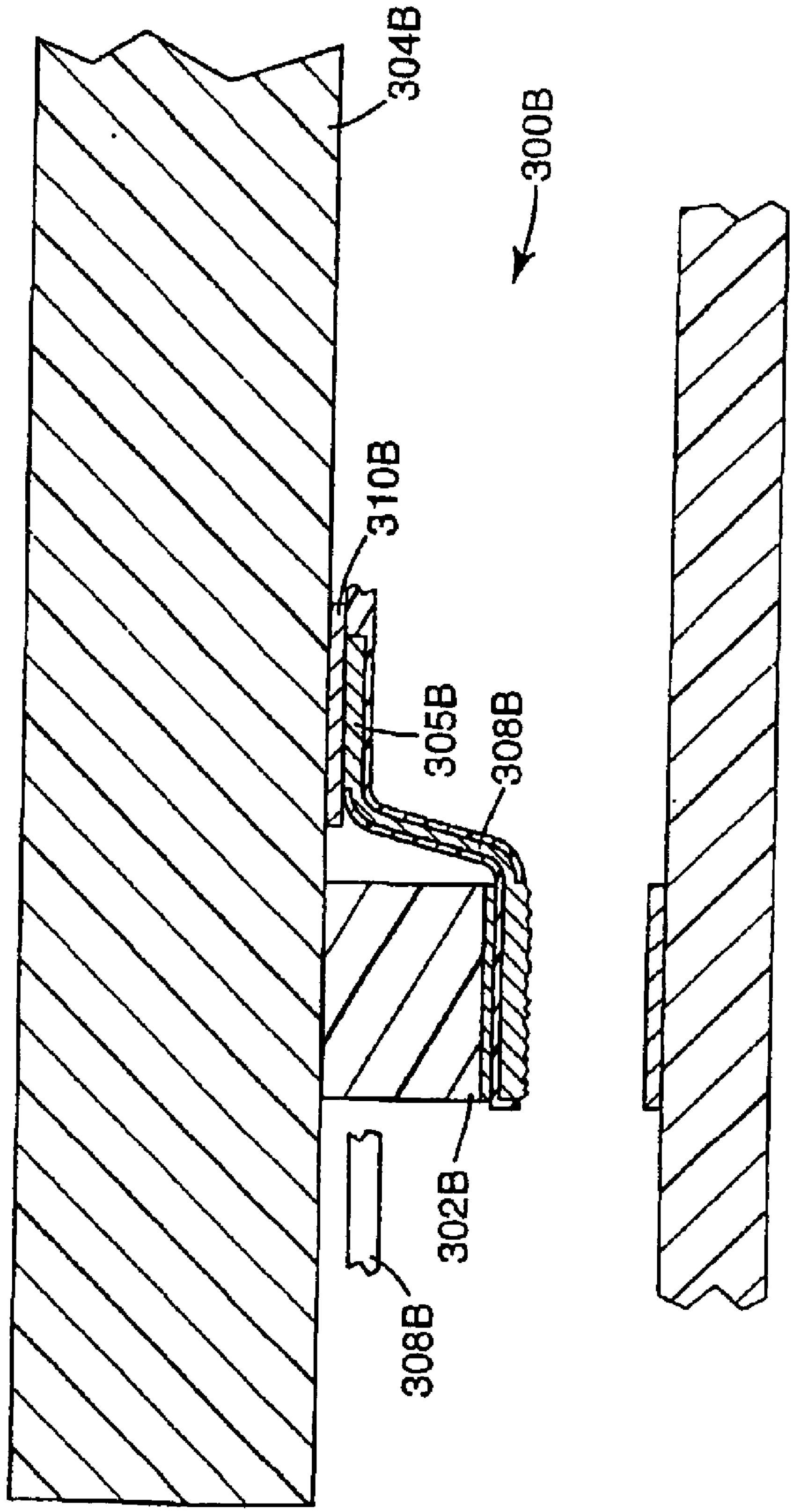
FIG. 14B is a side sectional view of an alternate compliant interconnect assembly on an integrated circuit device in accordance with the present invention.

FIG. 14B illustrates an alternate compliant interconnect assembly 300B generally as shown in FIG. 14A. Contact pad 305B on the flexible circuit member 308B is electrically coupled directly to the contact pad 310B on the first circuit member 304B. The raised compliant material 302B is attached to the circuit member 304B and is reduced in height to compensate for the height loss due to removal of the solder ball. The first circuit member 304B can be a printed circuit board, another flexible circuit, a bare-die device, an integrated circuit device, an organic or inorganic substrate, a rigid circuit and virtually any other type of electrical component.

Figure 15A:
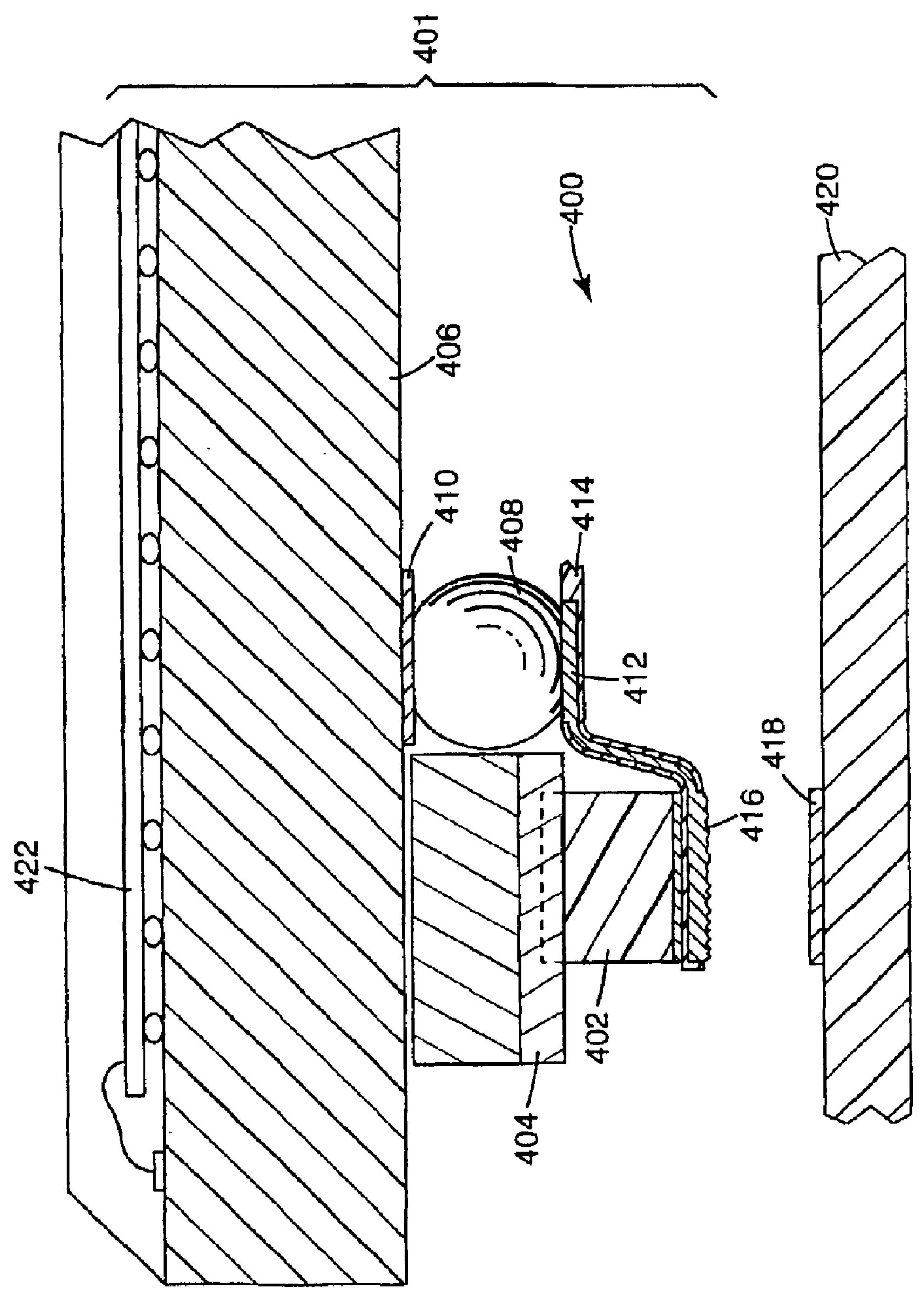
FIG. 15A is a side sectional view of a compliant interconnect assembly with a carrier and an integrated circuit device in accordance with the present invention.

FIG. 15A illustrates an alternate compliant interconnect assembly 400 in accordance with the present invention. Raised compliant material 402 is mounted on a carrier 404 that is positioned adjacent to the first circuit member 406. In the illustrated embodiment, the first circuit member 406 is a packaged integrated circuit device. The carrier 404 can be optionally bonded to the first circuit member 406. Ball grid array (BGA) solder ball 408 (or solder paste) is used to electrically couple contact pad 410 on the first circuit member 406 with the solder ball pad 412 on the flexible circuit member 414. The singulated contact pad 416 on the flexible circuit member 414 is supported by the raised compliant material 402 for compressive engagement with contact pad 418 on the second circuit member 420.

In one application, the embodiment of FIG. 15A can be used to "connectorize" a conventional BGA device 422 by adding the compliant interconnect assembly 400. In essence, the compliant interconnect assembly 400 can be merged into an existing BGA device 422 to form an assembly 401 comprising the packaged integrated circuit 406 and the compliant interconnect assembly 400. The contact pads 416 can simply be pushed against the PCB 420 to create a solderless connection without actually mounting a connector on the PCB 420. Alternately, solder at the interface of the contact pads 416, 418 can be reflowed. The assembly 401 can be provided as a conversion kit for integrated circuit devices, thereby eliminating the need for a connector on the printed circuit board 420. The connectorized embodiment of FIG. 15A can be used with any type of packaged integrated circuit, such as an LGA, PLCC, PGA, SOIC, DIP, QFP, LCC, CSP, or other packaged or unpackaged integrated circuits.

Figure 15B:
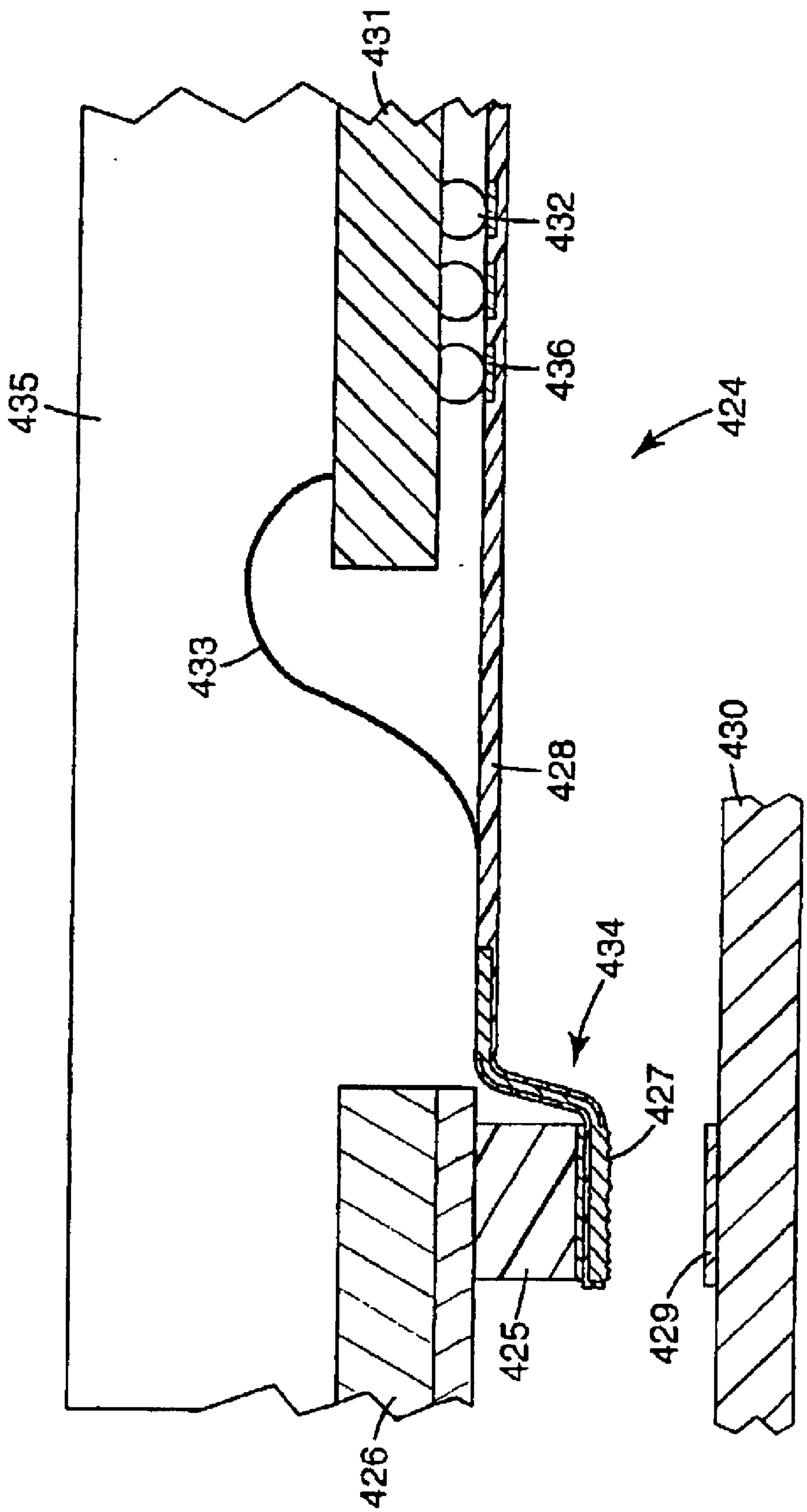
FIG. 15B is a side sectional view of a compliant interconnect assembly packaged with an integrated circuit device in accordance with the present invention.

FIG. 15B illustrates an alternate connectorized integrated circuit device 424 in accordance with the present invention. The compliant interconnect 434 includes raised compliant material 425 mounted on a carrier 426. Singulated contact pad 427 on flexible circuit member 428 is supported by the raised compliant material 426 for compressive engagement with contact pad 429 on the first circuit member 430. The connection between the contact pads 427, 429 can be created by compression or the reflow of solder. Integrated circuit device 431 is direct connected to the flexible circuit member 428. The integrated circuit device 431 can be electrically coupled to the flexible circuit member 428 by flip chip bumps 432 and/or wire bonds 433. Alternatively, terminals 436 on the integrated circuit device 431 can include locations of weakness (see FIG. 10A) that permit the bumps 432 to be snap-fit with the flexible circuit member 428 (see FIG. 19). The integrated circuit device can be an unpackaged bare die device. In one embodiment, the integrated circuit device 431, the compliant interconnect 434 and a portion of the flexible circuit member 428 can be retained in package 435.

Figure 16:
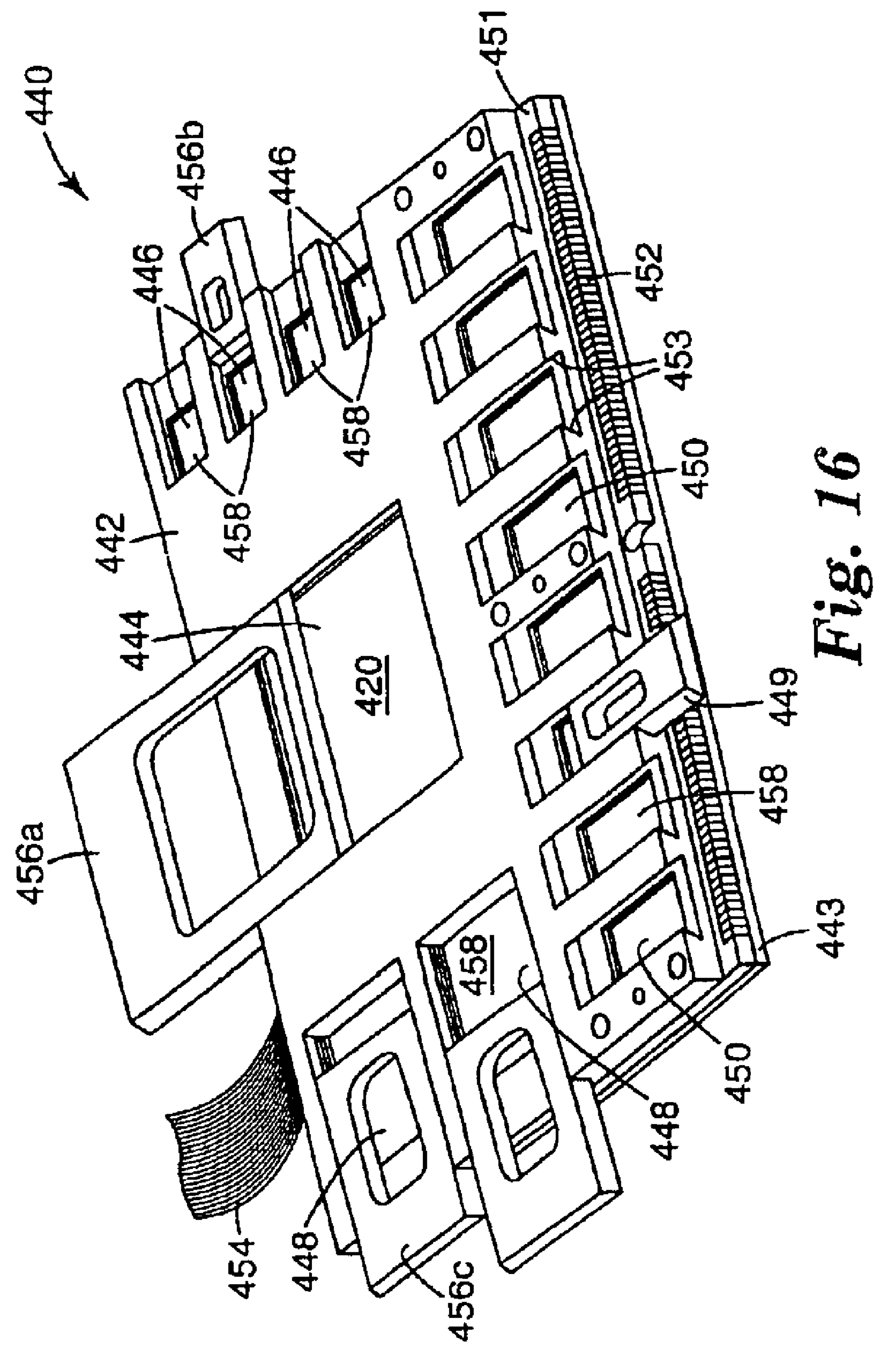
FIG. 16 is a replaceable chip module using the compliant interconnect assembly in accordance with the present invention.

FIG. 16 is a perspective view of a replaceable chip module 440 coupled to a flexible circuit member 454 using a compliant interconnect assembly in accordance with the present invention. The housing 442 includes a plurality of device sites 444, 446, 448, 450 configured to receive various first circuit members. The housing 442 can be an insulator housing or an alignment frame, typically constructed from plastic or shielded metal.

In one embodiment, the replaceable chip module 440 illustrated in FIG. 16 includes a second circuit member 451, such as a PCB, having a 168 DIMM edge card connector 452 along one edge. Flex circuit member 454 is interposed between the second circuit member 451 and the housing 442 to form compliant interconnect assemblies 458 at one or more of the device sites 444, 446, 448, 450. Various integrated circuit devices can be located at the device sites 444, 446, 448, 450. The flexible circuit member 454 may extend across the entire second circuit member 451, or just a portion thereof. Any of the compliant interconnect assemblies disclosed herein can be used for this purpose. The raised compliant material can correspondingly be formed on the first or second circuit members, or the substrate (see for example FIG. 5).

In another embodiment, the second circuit member 451 is an extension of the flexible circuit member 454. Stiffener 443 is optionally provided behind the flexible circuit member 451.

The housing 442 includes a device site 444 for receiving a microprocessor device. Along one edge of the housing 442 are a series of device sites 446 configured to receive flash memory integrated circuit devices. Device sites 448, 450 are provided along the other edges of the housing 442 for receiving other circuit members supportive of the microprocessor. Each of the device sites 444, 446, 448, 450 optionally include appropriate covers 456*a*–456*c*. The covers 456*a*–456*c* have beveled edges 449 for sliding engagement with a corresponding lips 453 on the housing 442.

The flexible circuit member 454 extends beyond the housing 442, permitting it to perform more functions than simple providing an interconnect between the first and second circuit members. For example, the flexible circuit member 454 can include integrated ground planes; buried passive functions such as capacitance; redistribution of terminal routing or pitch; and/or leads to bring in other signals or power from external sources to the device being connected without having to come in through the PCB 451. Using the flexible circuit member to perform other functions reduces the number of terminals need to be connected to the main PCB 451 since all of the ground pins from the first circuit members can be coupled to the flex circuit and/or the substrate. Another advantage of this embodiment is that it is possible to alter the signals or power coming in through the flexible circuit member 454, such as filtering, amplifying, decoupling etc.

Figure 17:
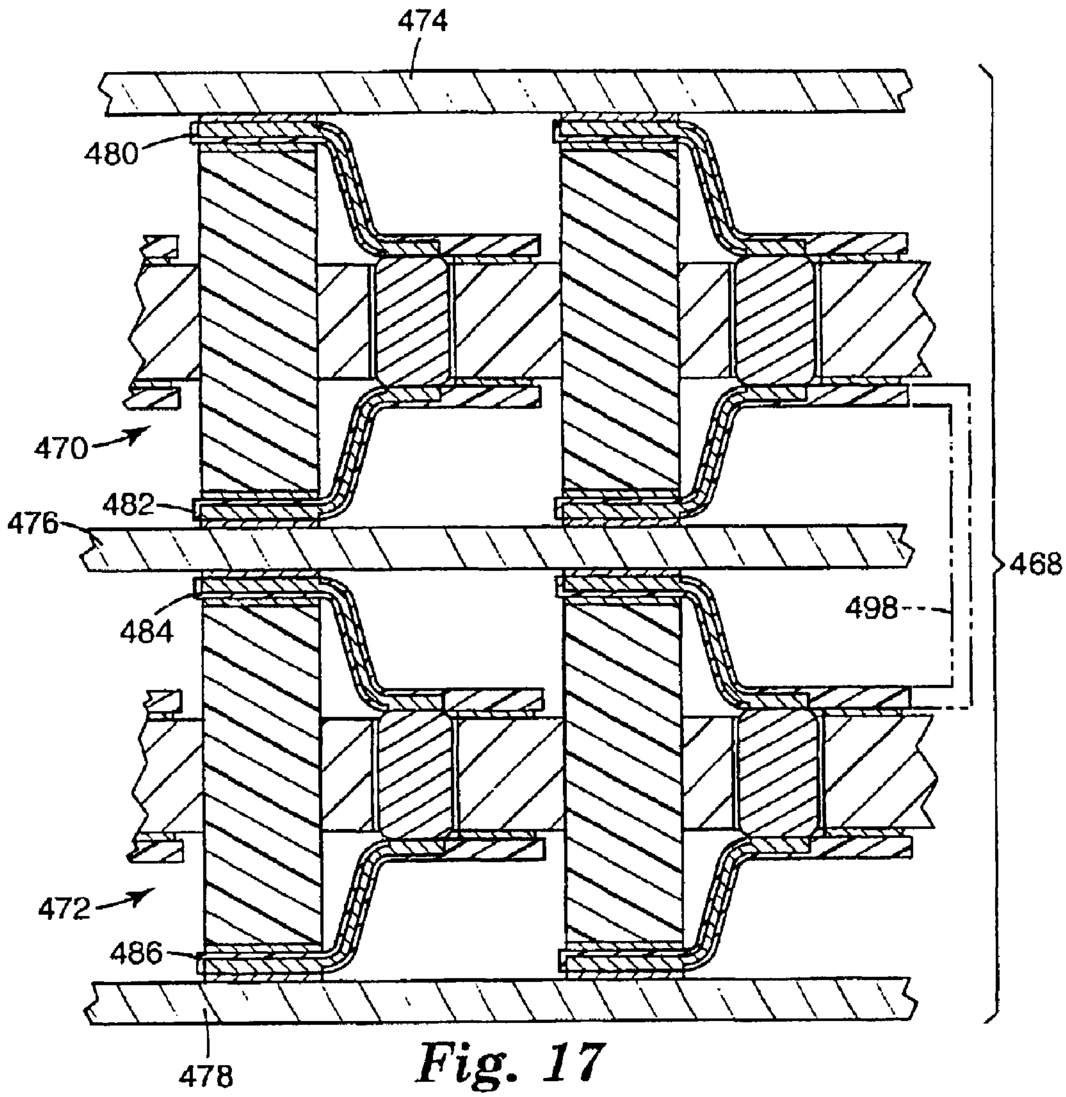
FIG. 17 is a side sectional view of a plurality of compliant interconnect assemblies in a stacked configuration in accordance with the present invention.
Figure 18:
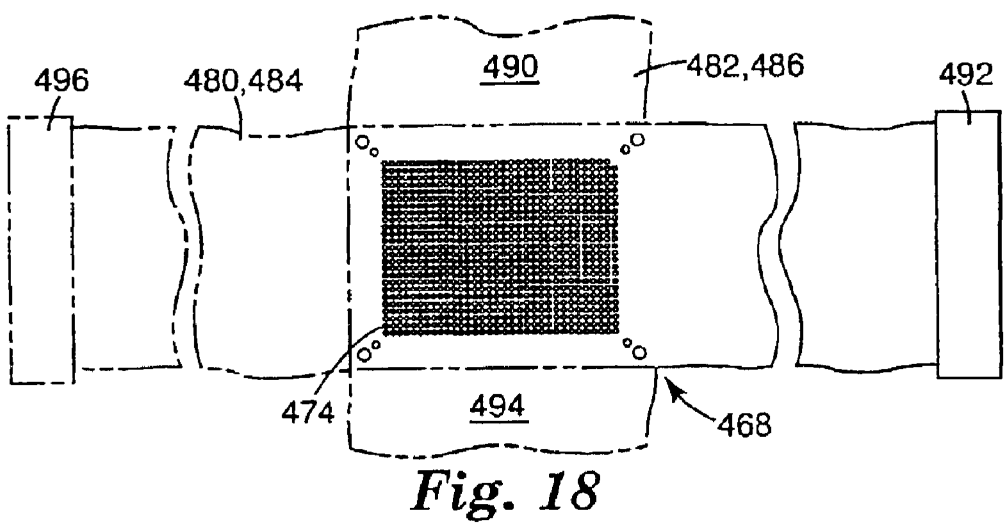
FIG. 18 is a top view of a compliant interconnect assembly with the flexible circuit members extending therefrom in accordance with the present invention.

FIG. 17 is a side sectional view of an assembly 468 comprising multiple compliant interconnect assemblies 470, 472 arranged in a stacked configuration with multiple circuit members 474, 476, 478 in accordance with the present invention. The interconnect assemblies 470, 472 correspond generally with those illustrated in FIG. 6, although any of the interconnect assemblies disclosed herein can be arranged in a stacked configuration. The circuit members 474, 476, 478 can be printed circuit boards, flexible circuits, bare-die devices, integrated circuit devices, organic or inorganic substrates, rigid circuits or combinations thereof. The assembly 468 is typically located in a housing (see FIG. 16) to maintain alignment and a compressive relationship with the various components. The four flexible circuit members 480, 482, 484, 486 can be arrange parallel to each other or at various angles. Additionally, the flexible circuit members 480, 482, 484, 486 can be connected to each other, such as the connection 498 connecting flexible circuit member 482 to flexible circuit member 484. FIG. 18 illustrates one possible arrangement of the flexible circuit members 480, 482, 484, 486 layered together with the circuit member 474 on top of the assembly 468. Distal ends 490, 492, 494, 496 of the various flexible circuit members 480, 482, 484, 486 are free to connect to other circuits.

Figure 19:
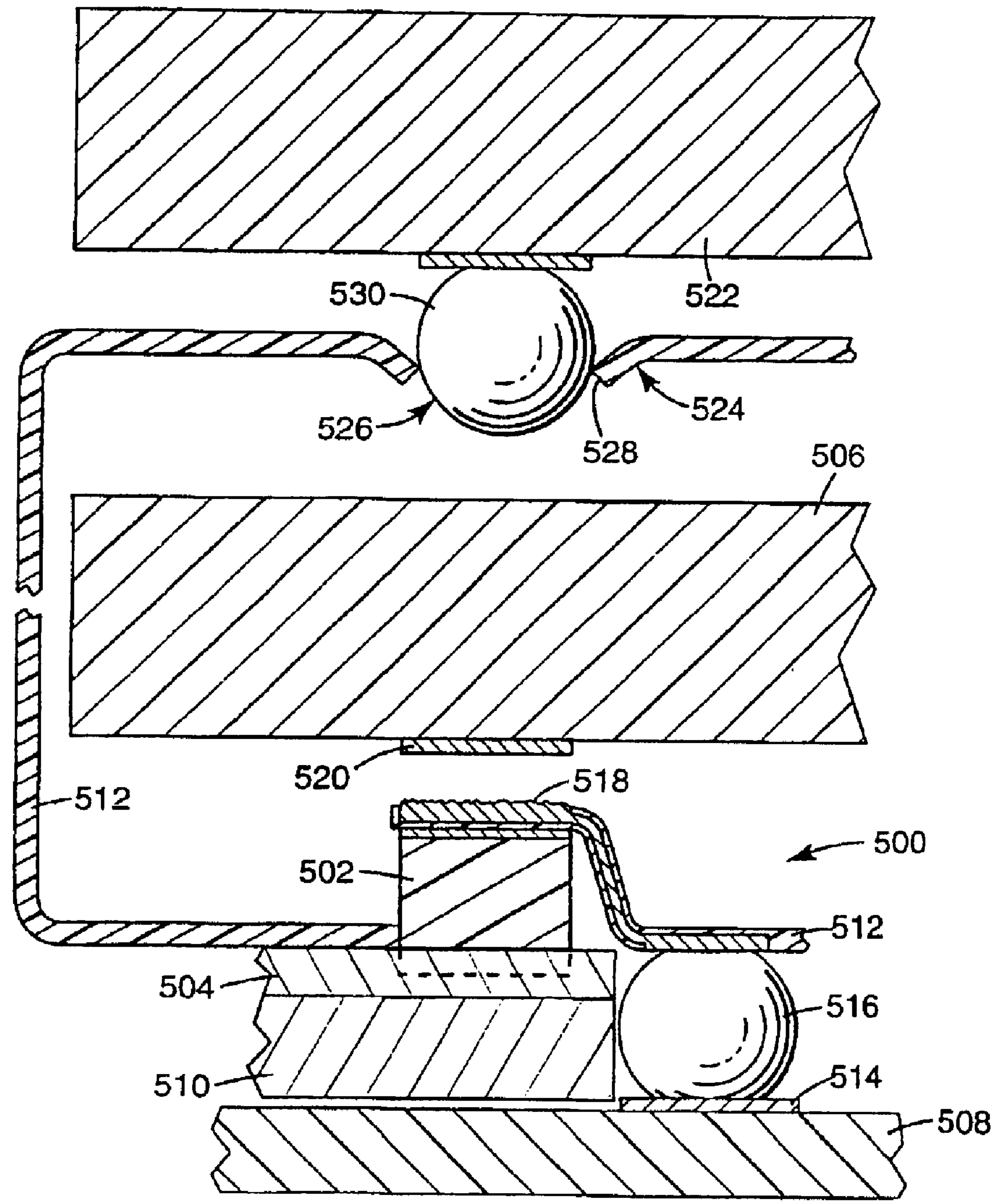
FIG. 19 is a side sectional view of a plurality of circuit members in a stacked configuration coupled using a compliant interconnect assembly in accordance with the present invention.

FIG. 19 illustrates an alternate compliant interconnect assembly 500 using a compliant interconnect generally as illustrated in FIGS. 12A. Raised compliant material 502 is attached to a carrier 504 that is interposed between first and second circuit members 506, 508. The carrier 504 can be rigid or flexible. An additional support layer 510 can optionally be added to the carrier 504 to increase rigidity and/or compliance. Flexible circuit member 512 is electrically coupled to the contact pad 514 on second circuit member 508 by solder ball or solder paste 516. When the first circuit member 506 is compressively engaged with the compliant interconnect assembly 500, raised compliant material 502 biases contact pad 518 on the flexible circuit member 512 against contact pad 520 on the first circuit member 506.

In one embodiment, the flexible circuit member 512 extends to a third circuit member 522. The third circuit member 522 can be electrically coupled using any of the techniques disclosed herein, including the connectorized approach illustrated in FIG. 15B. In the illustrated embodiment, terminals 524 on the flexible circuit 512 include an aperture 526 and a plurality of locations of weakness 528 (see FIG. 10A). The locations of weakness 528 permit solder ball 530 to snap-fit into aperture 526 to form a strong mechanical interconnect. The solder ball 530 can optionally be reflowed to further bind with the terminal 524. If the solder ball 530 is reflowed, the segmented portions of the terminal 524 will flex into the molten solder. When the solder solidifies, the terminal 524 will be at least partially embedded in the solder ball 530. The third circuit member 522 can be an integrated circuit device, such as an LGA device, BGA device, CSP device, flip chip, a PCB or a variety of other devices.

Figure 20:
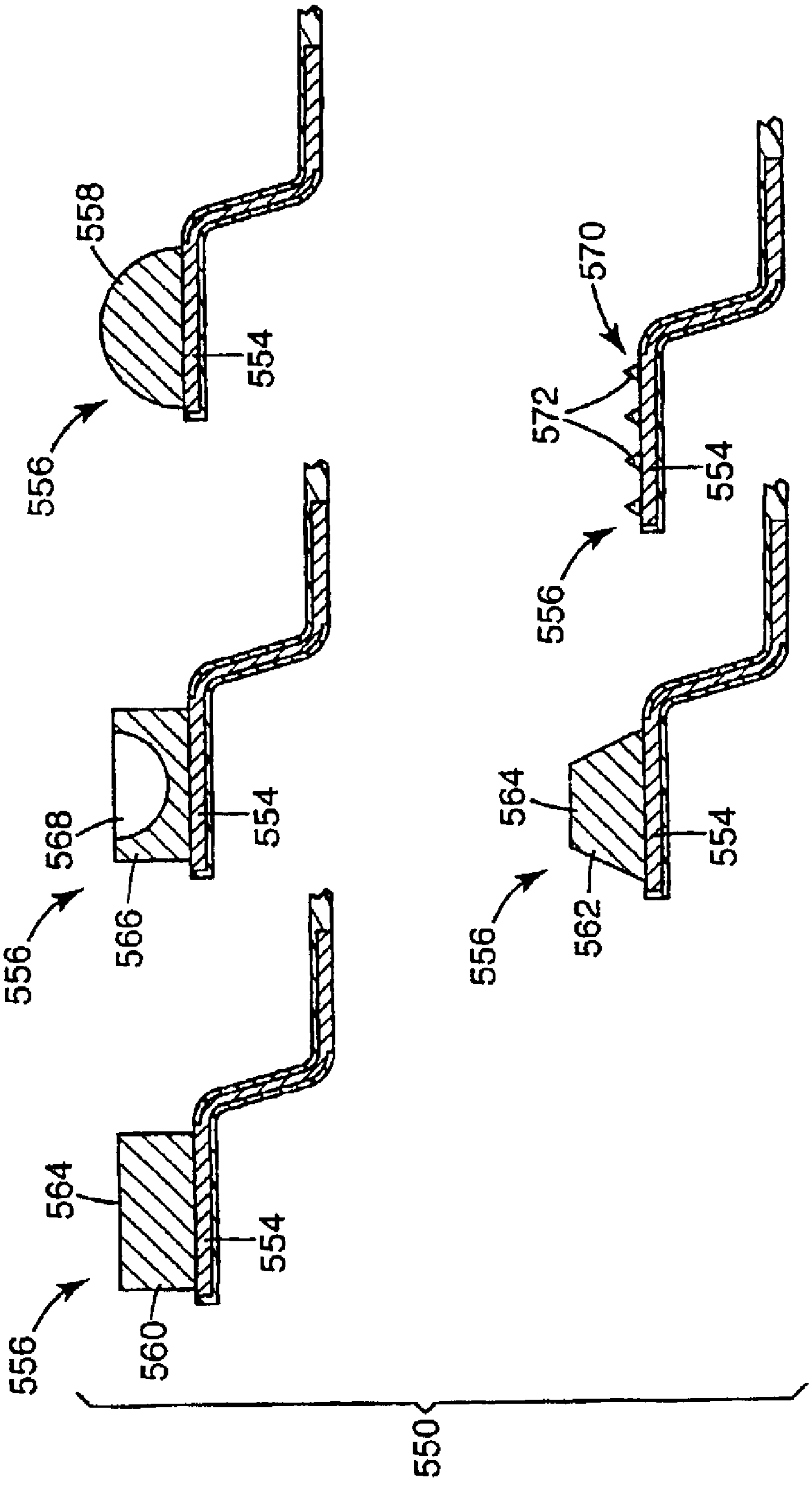
FIG. 20 is a side sectional view of various structures on a flexible circuit member for electrically coupling with a circuit member.

FIG. 20 is a schematic illustration of various conductive structures 556 formed on the contact pads 554 of flexible circuit member 550. The conductive structures 556 facilitate electrical coupling with various types of contact pads on a circuit member. The structures 556 can be metal pieces soldered to the contact pads 554, a build-up of solder or conductive adhesive or other conductive members bonded to the contact pads 554. Structures 560 and 562 include generally flat upper surfaces 564 suitable to engage with an LGA device. Structure 566 includes a recess 568 generally complementary to the contact pads on a BGA device. Structure 570 includes a series of small protrusions 572 designed to frictionally engage with various contact pads. Structure 558 is a solder bump, such as may be found on a BGA device. The conductive structures 556 can be coupled with a circuit member using compression and/or reflowing the solder.

The embodiments disclosed herein are basic guidelines, and are not to be considered exhaustive or indicative of the only methods of practicing the present invention. There are many styles and combinations of properties possible, with only a few illustrated. Each connector application must be defined with respect to deflection, use, cost, force, assembly, & tooling considered.

Patents and patent applications disclosed herein, including those cited in the background of the invention, are hereby incorporated by reference. Other embodiments of the invention are possible. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A compliant interconnecting assembly comprising:

a substrate having first and second surfaces;

at least one flexible circuit member having a first surface with a plurality of first contact pads and a second surface; and a plurality of elongated compliant spring members interposed between the substrate and the second surface of the flexible circuit member, one or more of the compliant elongated spring members being aligned with one or more of the first contact pads to bias the first contact pads away from the substrate when the second surface of the flexible circuit member is displaced toward the first substrate of the substrate.

2. The compliant interconnect assembly of claim 1 wherein the substrate comprises one of a printed circuit board, a flexible circuit, a bare die device, an integrated circuit device, a carrier, organic or inorganic substrates, a compliant material, or a rigid circuit.

3. The compliant interconnect assembly of claim 1 wherein a portion of the second surface of the flexible circuit member is attached to the first surface of the substrate.

4. The compliant interconnect assembly of claim 1 wherein the compliant spring members are attached to the substrate.

5. The compliant interconnect assembly of claim 1 wherein the compliant spring members are attached to the flexible circuit member.

6. The compliant interconnect assembly of claim 1 wherein the compliant spring members comprise a first modulus of elasticity and the substrate comprises a compliant material having a second modulus of elasticity different from the first modulus of elasticity.

7. The compliant interconnect assembly of claim 1 comprising a first circuit member having contact pads aligned with the first contact pads on the first surface of the flexible circuit member, the first circuit member being compressively engaged with the compliant interconnect assembly so that the compliant spring members bias the first contact pads against corresponding contact pads on the first circuit member.

8. The compliant interconnect assembly of claim 1 wherein the substrate comprises a plurality of holes.

9. The compliant interconnect assembly of claim 1 wherein one or more of the first contact pads on the flexible circuit member comprise singulated contact pads.

10. The compliant interconnect assembly of claim 1 comprising a singulation extending partially around a plurality of the first contact pads on the flexible circuit member.

11. The compliant interconnect assembly of claim 1 comprising one or more locations of weakness proximate one or more of the first contact pads.

12. The compliant interconnect assembly of claim 1 wherein at least one of the first contact pads comprises one or more locations of weakness adapted to receive a solder ball on a circuit member in a snap-fit arrangement.

13. The compliant interconnect assembly of claim 1 wherein at least one of the first contact pads comprises an aperture adapted to receive a solder ball on a circuit member in a snap-fit arrangement.

14. The compliant interconnect assembly of claim 1 comprising second contact pads on the second surface of the flexible circuit member.

15. The compliant interconnect assembly of claim 1 wherein the substrate comprises a first circuit member having one or more contact pads coupled with contact pads on the second surface of the flexible circuit member.

16. The compliant interconnect assembly of claim 1 wherein a portion of the flexible circuit member extends beyond the compliant interconnect assembly.

17. The compliant interconnect assembly of claim 1 comprising a bare die device bonded to the portion of the flexible circuit member.

18. The compliant interconnect assembly of claim 1 wherein the substrate comprises a first circuit member and a portion of the flexible circuit member extends beyond the compliant interconnect assembly to a second circuit member.

19. The compliant interconnect assembly of claim 18 wherein the first circuit member and the second circuit member comprise a stacked configuration.

20. The compliant interconnect assembly of claim 18 wherein the flexible circuit member is bent about 180 degrees so that the first and second circuit members are in a back to back configuration.

21. The compliant interconnect assembly of claim 18 wherein the flexible circuit member is bent about 180 degrees so that the first and second circuit members are in a back to back configuration with a second flexible circuit member interposed between the first and second circuit members.

22. The compliant interconnect assembly of claim 1 wherein the first contact pads are adapted to electrically couple with contact pads on a first circuit member.

23. The compliant interconnect assembly of claim 1 wherein the first contact pads having a shape complementary to a shape of the contact pads on a first circuit member.

24. The compliant interconnect assembly of claim 1 wherein the first contact pads on the flexible circuit member are adapted to engage with a connector member selected from the group consisting of a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DW), a quad flat package (QFP), a leadless chip carrier (LCC), a chip scale package (CSP), or packaged or unpackaged integrated circuits.

25. A compliant interconnect assembly of claim 1 wherein the substrate includes a plurality of holes and the second surface of the flexible circuit member comprises a plurality of second contact pads aligned with the holes in the substrate.

26. The compliant interconnect assembly of claim 1 wherein the second surface of the flexible circuit member comprises a plurality of singulated second contact pads.

27. The compliant interconnect assembly of claim 1 comprising a second flexible circuit member having a first surface with a plurality of first contact pads, the first surface of the second flexible circuit member being located along the second surface of the substrate so that the first contact pads of the second flexible circuit member are aligned with a plurality of holes in the substrate.

28. The compliant interconnect assembly of claim 27 wherein the second contact pads on the first flexible circuit member and the first contact pads on the second flexible circuit members are electrically coupled through the holes in the substrate.

29. The compliant interconnect assembly of claim 27 wherein the second surface of the second flexible circuit member comprises a plurality of second contact pads aligned with the compliant raised portions on the second surface of the substrate.

30. The compliant interconnect assembly of claim 27 comprising a compliant material interposed between the second surface of the substrate and the second flexible circuit member.

31. The compliant interconnect assembly of claim 1 wherein the substrate comprises a first circuit member and a portion of the flexible circuit member extends beyond the compliant interconnect assembly to a second compliant interconnect assembly electrically coupled with a second circuit member.

32. The compliant interconnect assembly of claim 1 comprising an electrical assembly having a plurality of circuit members electrically coupled with the flexible circuit member.

* * * * *

UNITED STATES PATENT AND TRADEMARK OFFICE

CERTIFICATE OF CORRECTION

PATENT NO. : 6,939,143 B2
DATED : September 6, 2005
INVENTOR(S) : James J. Rathburn It is certified that error appears in the above-identified patent and that said Letters Patent is hereby corrected as shown below:

Title page,
Item [56], References Cited, U.S. PATENT DOCUMENTS, delete "695,623 A1" and replace with -- 6,695,623 A1 --.

Column 14,
Line 55, delete "interconnecting" and replace with -- interconnect --.
Line 67, after "first"; delete "substrate" and replace with -- surface --.

Column 16,
Line 22, delete "(DW)" and replace with -- (DIP) --.

Signed and Sealed this

Eighteenth Day of April, 2006

JON W. DUDAS
*Director of the United States Patent and Trademark Office*